(12) United States Patent
Ohnuma et al.

(10) Patent No.: US 7,807,516 B2
(45) Date of Patent: Oct. 5, 2010

(54) SEMICONDUCTOR DEVICE AND MANUFACTURING METHOD OF THE SAME

(75) Inventors: Hideto Ohnuma, Kanagawa (JP); Shigeharu Monoe, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 880 days.

(21) Appl. No.: 11/425,545

(22) Filed: Jun. 21, 2006

(65) Prior Publication Data

US 2007/0001225 A1      Jan. 4, 2007

(30) Foreign Application Priority Data

Jun. 30, 2005    (JP)    ............................. 2005-192302

(51) Int. Cl.
*H01L 21/84*    (2006.01)
(52) U.S. Cl. ................. 438/151; 438/163; 257/E21.411
(58) Field of Classification Search ................. 438/163, 438/151; 257/E21.411
See application file for complete search history.

(56) References Cited

U.S. PATENT DOCUMENTS

| | | | |
|---|---|---|---|
| 5,412,493 A | | 5/1995 | Kunii et al. |
| 6,074,900 A | | 6/2000 | Yamazaki et al. |
| 6,355,512 B1 | | 3/2002 | Yamazaki et al. |
| 6,677,221 B2 * | | 1/2004 | Kawasaki et al. ........... 438/486 |
| 6,909,411 B1 | | 6/2005 | Yamazaki et al. |
| 7,041,540 B1 * | | 5/2006 | Chang et al. ................. 438/163 |
| 7,064,020 B2 * | | 6/2006 | Yamazaki ................... 438/151 |
| 7,145,536 B1 | | 12/2006 | Yamazaki et al. |
| 7,172,931 B2 * | | 2/2007 | Monoe et al. ............... 438/163 |
| 7,344,931 B2 * | | 3/2008 | Sera et al. .................. 438/163 |
| 2002/0025591 A1 | | 2/2002 | Ohnuma et al. |
| 2006/0014335 A1 | | 1/2006 | Ohnuma et al. |
| 2006/0278875 A1 * | | 12/2006 | Ohnuma et al. ............... 257/66 |

FOREIGN PATENT DOCUMENTS

JP    08-139337    5/1996

(Continued)

OTHER PUBLICATIONS

Japan 08-139337—English abstract provided by esp@cenet Worldwide (2006) and family to U.S. Patent No. 6,074,900 (Desig. ID "AD") and U.S. Patent No. 6,355,512 (Desig. ID "AE").

(Continued)

*Primary Examiner*—W. David Coleman
*Assistant Examiner*—Sun M Kim
(74) *Attorney, Agent, or Firm*—Fish & Richardson P.C.

(57) ABSTRACT

To provide a manufacturing method in which LDD regions with different widths are formed in a self-aligned manner, and the respective widths are precisely controlled in accordance with each circuit. By using a photomask or a reticle provided with an auxiliary pattern having a light intensity reduction function formed of a diffraction grating pattern or a semi-transparent film, the width of a region with a small thickness of a gate electrode can be freely set, and the widths of two LDD regions capable of being formed in a self-aligned manner with the gate electrode as a mask can be different in accordance with each circuit. In one TFT, both of two LDD regions with different widths overlap a gate electrode.

10 Claims, 12 Drawing Sheets

FOREIGN PATENT DOCUMENTS

| | | |
|---|---|---|
| JP | 10-027913 | 1/1998 |
| JP | 2002-151523 | 5/2002 |

OTHER PUBLICATIONS

Japan 10-027913—English abstract provided by esp@cenet Worldwide (2006).

Japan 2002-151523—English abstract provided by esp@cenet Worldwide (2006) and family to U.S. Patent Application Publication No. 2002/0025591 (Desig. ID "AA") and U.S. Patent Application Publication No. 2006/0014335 (Desig. ID "AB").

Hideto Ohnuma et al.; U.S. Appl. No. 11/383,694, filed May 16, 2006.

Hideto Ohnuma et al.; U.S. Appl. No. 11/421,922, filed Jun. 2, 2006.

\* cited by examiner

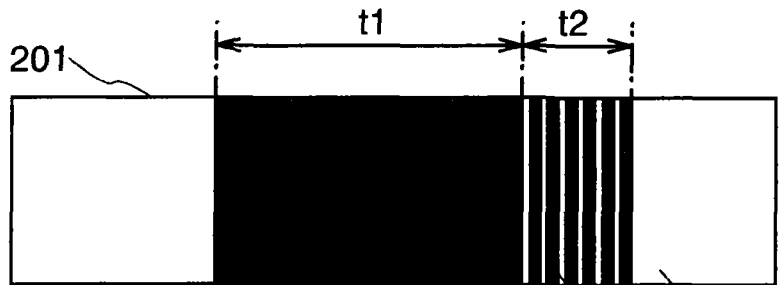
FIG. 2A
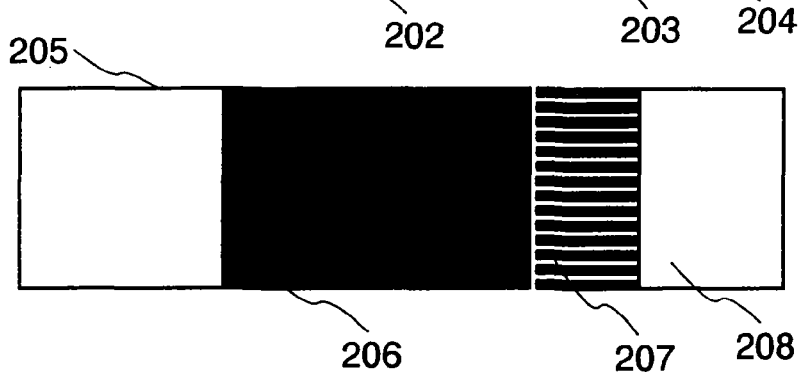
FIG. 2B
FIG. 2C
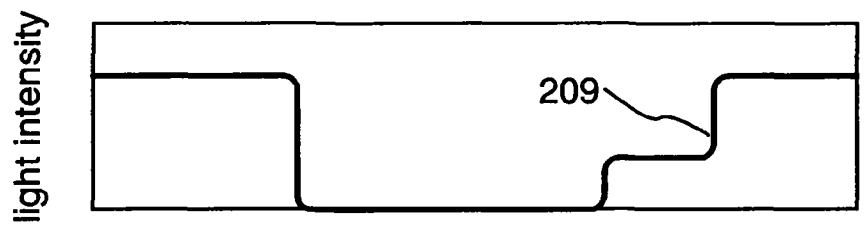
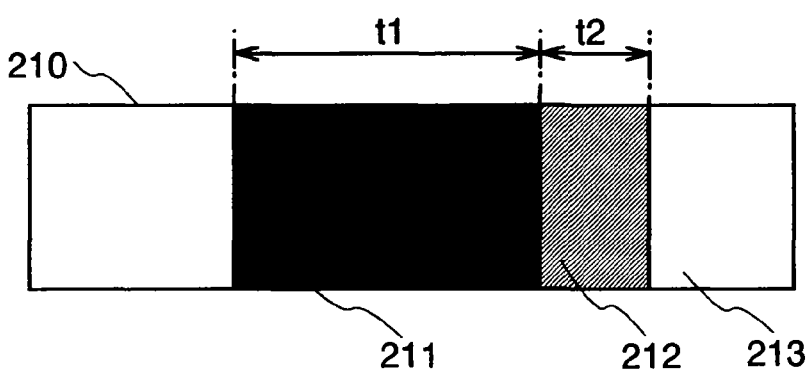
FIG. 2D
FIG. 2E
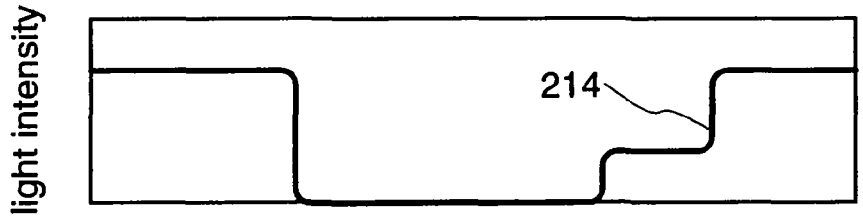

SEMICONDUCTOR DEVICE AND MANUFACTURING METHOD OF THE SAME

BACKGROUND OF THE INVENTION

1. Field of the Invention

The present invention relates to a semiconductor device having a circuit constituted by a thin film transistor (hereinafter referred to as a "TFT") and a manufacturing method of the same. For example, the invention relates to electronic equipment on which an electro-optical device typified by a liquid crystal display panel or a light emitting display device having an organic light-emitting element (or an inorganic light-emitting element) is mounted as a component.

In this specification, 'semiconductor device' means any device that can function by utilizing semiconducting properties, and electro-optical devices, semiconductor circuits and electronic equipment are all included in the semiconductor device.

2. Description of the Related Art

In recent years, a technique for forming a thin film transistor (TFT) by using a semiconductor thin film (with a thickness of about several nm to several hundreds of nm) formed over a substrate having an insulating surface has drawn attention. The thin film transistor has been widely applied to electronic equipment such as an IC and an electro-optical device, and developed rapidly, particularly as a switching element for an image display device.

For example, in an active matrix liquid crystal display device, a pixel circuit for performing image display for each functional block, and a driving circuit for controlling the pixel circuit, such as a shift register circuit based on a CMOS circuit, a level shifter circuit, a buffer circuit, and a sampling circuit are formed over one substrate.

It is important to lower the off-current value (a drain current which flows when the TFT is OFF) enough for low power consumption in various circuits.

As a TFT structure to reduce the off-current value, a low concentration drain (LDD: Lightly Doped Drain) structure is known. In this structure, a region in which an impurity element is added at a low concentration is provided between a channel forming region and a source region or a drain region which is formed by adding an impurity element at a high concentration. This region is called an LDD region. Further, as a means for preventing deterioration of the on-current value due to a hot carrier, a structure in which an LDD region is provided so as to overlap the gate electrode with a gate insulating film in between, a so-called GOLD (Gate-drain Overlapped LDD) structure, is known. It is known that by employing such a structure, the high electric field around the drain is eased and hot carrier implantation is prevented, which is effective in preventing the deterioration phenomenon.

In Patent Document 1, a TFT in which LDD regions having different widths are provided with a channel forming region interposed therebetween has been disclosed. The two LDD regions having different widths are formed using a resist mask. Note that the LDD regions do not overlap a gate electrode.

In Patent Document 2, an LDD region which is formed to overlap a gate electrode by doping obliquely with respect to a substrate surface has been disclosed.

In addition, the present applicant has disclosed a TFT manufacturing process in which a photomask or a reticle provided with an auxiliary pattern having a light intensity reduction function formed of a diffraction grating pattern or a semi-transparent film is applied in a step of photolithography for forming a gate electrode, in Patent Document 3.

[Patent Document 1] Japanese Patent Laid-Open No. Hei 10-27913

[Patent Document 2] Japanese Patent Laid-Open No. Hei 8-139337

[Patent Document 3] Japanese Patent Laid-Open No. 2002-151523

SUMMARY OF THE INVENTION

Conventionally, when various circuits are to be formed over the same substrate and a TFT with a structure suitable for each circuit is to be formed, there has been a problem in that the manufacturing process becomes complicated and the number of steps increases. It is clear that the increase in the number of steps is not only a factor in increasing manufacturing cost, but also a cause of reducing manufacturing yield.

The present invention provides a manufacturing method for forming a TFT provided with a structure suitable for each circuit over the same substrate, without increasing the number of steps.

In addition, in the above-described technology disclosed in Patent Document 1, the LDD region which does not overlap the gate electrode is formed by using a resist mask in doping. Thus, the width of the LDD region tends to depend on the resist mask formed by exposure.

Further, in the technology disclosed in Patent Document 2, the LDD region is formed in a self-aligned manner, however, respective widths of the LDD regions disposed with the channel forming region interposed therebetween are equal, and it is difficult to control the width in accordance with each circuit.

The present invention provides a manufacturing method in which LDD regions having different widths are formed in a self-aligned manner, and the respective widths and formation positions are precisely controlled in accordance with each circuit.

According to the invention, a photomask or a reticle provided with an auxiliary pattern having a light intensity reduction function formed of a diffraction grating pattern or a semi-transparent film is used, so that the width of a region of a gate electrode where the thickness is small can be freely set and the respective widths of two LDD regions formed in a self-aligned manner by using the gate electrode as a mask can be changed in accordance with each circuit. For example, as for driver circuits, it is preferable that the total width (the width in a direction of channel length) of the LDD region is small in a thin film transistor used in the first circuit that requires high-speed drive, thereby achieving reduction of power consumption of the driver circuits as a whole. In addition, as for the driver circuits, it is preferable that the total width (the width in a direction of channel length) of the LDD region is large in a thin film transistor used in the second circuit that requires resistance to pressure, thereby improving reliability of the driver circuits as a whole.

One feature of the invention is a manufacturing method in which a photomask or a reticle provided with an auxiliary pattern having a light intensity reduction function formed of a diffraction grating pattern or a semi-transparent film is applied in a step of photolithography for forming a gate electrode to form a left-right asymmetrical resist pattern having a region with a large thickness and a region with a thickness smaller than the aforementioned region, a gate electrode having a step is formed, and an impurity element is injected into a semiconductor layer through a region with a small thickness of the gate electrode, so that an LDD region is formed in a self-aligned manner. In a TFT structure according to the invention, one region in which an impurity element is added at a low concentration is provided between a channel forming region and a drain region which is formed by adding an impurity element at a high concentration, and this region is called an LDD region.

In addition, an obtained structure is also one feature of the invention, and one feature is that a gate electrode having a step, that is, a gate electrode having a region with a large thickness and regions with a thickness smaller than the above region respectively on both sides of the aforementioned thick region is included, and an LDD region which overlaps the thin region of the gate electrode with an insulating layer interposed therebetween is included. According to the structure in which the LDD region which overlaps the thin region of the gate electrode with the insulating layer interposed therebetween is included, the electric field intensity around the drain is eased and hot carrier implantation is prevented, which is effective in preventing a deterioration phenomenon.

In addition, according to the invention, the respective widths of the two LDD regions formed with the channel forming region interposed therebetween are made different from each other. For example, the width of the LDD region on the drain region side is made larger than that of the LDD region on the source region side. Note that the LDD region which overlaps the gate electrode is also called a Lov region. Patent Document 3 has disclosed a structure in which a left-right symmetrical resist pattern is formed and Lov regions are formed respectively on both sides of a channel forming region. On the other hand, the invention discloses a structure in which a left-right asymmetrical resist pattern is formed and Lov regions with different widths are formed with a channel forming region interposed therebetween.

A structure of the invention disclosed in this specification is a semiconductor device which has a semiconductor layer above a substrate having an insulating surface, a gate insulating layer above the semiconductor layer, and a gate electrode structured by stacking a conductive layer over the gate insulating layer, in which: the semiconductor layer includes a source region, a drain region, a channel forming region, an impurity region which is provided between the channel forming region and the source region, and an impurity region which is provided between the channel forming region and the drain region; a first conductive layer constituting one of the stacked-layer of the gate electrode overlaps at least the channel forming region and the impurity regions; a second conductive layer constituting one of the stacked-layer of the gate electrode is directly on the first conductive layer and overlaps the channel forming region; and the width of the impurity region disposed between the channel forming region and the drain region is larger than that of the impurity region disposed between the channel forming region and the source region.

In the above-described structure, one feature is that the impurity region contains an n-type or a p-type impurity element at a lower concentration than the source region and the drain region. That is to say, the impurity region is an LDD region.

In addition, in the above-described structure, one feature is that the first conductive layer and the second conductive layer are formed of different materials to each other. By forming the first conductive layer and the second conductive layer with different materials to each other, difference can be provided in the etching rate, thereby the structure described above can be formed more easily.

In addition, in the above-described structure, one feature is that the thickness of the first conductive layer is smaller than that of the second conductive layer. By forming the first conductive layer to be thin, a second impurity region can be easily formed in the case where an impurity element is added into the semiconductor layer through the first conductive layer.

In addition, one feature is that the width of the second conductive layer is equal to that of the channel forming region. That the width of the second conductive layer is equal to that of the channel forming region means that a first impurity region and a second impurity region are formed in a self-aligned manner.

An AC drive is performed in a liquid crystal display device in order to prevent deterioration of liquid crystal. Through the AC drive, the polarity of a signal potential applied to a pixel electrode is inverted to be negative or positive at regular intervals of time. In a TFT connected to the pixel electrode, two high-concentration impurity regions function alternately as a source and a drain respectively. Therefore, a TFT for switching disposed in a pixel of a liquid crystal display device preferably has LDD regions with the same widths respectively provided on both sides of a channel forming region.

In addition, when a pixel portion and a driver circuit are formed over the same substrate in the liquid crystal display device, in the driver circuit, only one of positive polarity or negative polarity is applied between the source and drain electrodes to a transistor for constituting a logic gate such as an inverter circuit, a NAND circuit, a NOR circuit, and a latch circuit or a transistor for constituting an analog circuit such as a sense amplifier, a constant voltage generating circuit, and a VCO. Therefore, it is preferable that the width of one LDD region, which requires resistance to pressure, is made larger than the width of the other LDD region.

TFTs with different structures can be formed over the same substrate. Another structure of the invention is a semiconductor device having a first thin film transistor including a first semiconductor layer and a second thin film transistor including a second semiconductor layer above the same substrate, in which: the first semiconductor layer and the second semiconductor layer are formed above the substrate having an insulating surface, a gate insulating layer is formed above the first semiconductor layer and the second semiconductor layer, and a first gate electrode and a second gate electrode structured by stacking a conductive layer are formed over the gate insulating layer; the first semiconductor layer includes a first channel forming region, a first source region, a first drain region, and first impurity regions with different widths respectively provided on both sides of the first channel forming region; the first channel forming region overlaps the first gate electrode through the gate insulating layer; a first conductive layer constituting one of the stacked-layer of the first gate electrode overlaps at least the first channel forming region and the first impurity regions; a second conductive layer constituting one of the stacked-layer of the first gate electrode is directly on the first conductive layer and overlaps the first channel forming region; the second semiconductor layer includes a second channel forming region, second impurity regions with the same widths respectively provided on both sides of the second channel forming region, a source region, and a drain region; the second channel forming region overlaps the second gate electrode through the gate insulating layer; in which the first conductive layer constituting one of the stacked-layer of the second gate electrode overlaps at least the second channel forming region and the second impurity regions; and the second conductive layer constituting one of the stacked-layer of the second gate electrode is directly on the first conductive layer and overlaps the second channel forming region.

In the above-described structure, one feature is that the first impurity region and the second impurity region contain an n-type or a p-type impurity element at a lower concentration than the source region and the drain region. That is to say, the first impurity region and the second impurity region are LDD regions.

According to the above-described structure, a TFT including two LDD regions having the same widths respectively on both sides of the channel forming region and a TFT including two LDD regions having different widths respectively on both sides of the channel forming region can be formed over the same substrate, and each TFT can be used for a suitable circuit.

In addition, a manufacturing process for achieving the above-described structure is also one feature of the invention. The structure of the invention is a manufacturing method of a semiconductor device, including: forming an insulating film over a semiconductor layer; forming a conductive film over the insulating film; forming a resist pattern having a region with a large thickness and a region with a thickness smaller than that of the above region on both side portions respectively over the conductive film by using a photomask or a reticle having a diffraction grating pattern or a semi-transparent portion; selectively etching the conductive film to form a gate electrode having a region with a large thickness and a region with a thickness smaller than that of the above region on both side portions respectively; injecting an impurity element into the semiconductor layer with the gate electrode as a mask to form a source region and a drain region in the semiconductor layer; and injecting an impurity element into the semiconductor layer through the region with a small thickness of the gate electrode to form a first impurity region and a second impurity region in a region overlapped with the gate electrode with a small thickness in the semiconductor layer, in which the width of the first impurity region is larger than that of the second impurity region.

In addition, in order to shorten the manufacturing process, only one doping may be performed. The structure of the invention is a manufacturing method of a semiconductor device, including: forming an insulating film over a semiconductor layer; forming a conductive film over the insulating film; forming a resist pattern having a region with a large thickness and a region with a thickness smaller than that of the above region on one both side portions respectively over the conductive film by using a photomask or a reticle having a diffraction grating pattern or a semi-transparent portion; selectively etching the conductive film to form a gate electrode having a region with a large thickness and a region with a thickness smaller than that of the above region on both side portions respectively; and injecting an impurity element into the semiconductor layer with the gate electrode as a mask to form a source region and a drain region respectively on both sides of a channel forming region in the semiconductor layer and to form a first impurity region and a second impurity region in a region overlapped with the gate electrode with a small thickness in the semiconductor layer through the region with a small thickness of the gate electrode, in which the width of the first impurity region is larger than that of the second impurity region.

According to the invention, one LDD region having a width (a length in a channel length direction) of 0.5 µm or more, preferably 1 to 1.5 µm, and more preferably 2 µm or more, can be provided in a self-aligned manner without increasing the number of steps. In addition, the other LDD region may be formed with a width smaller than that of the above LDD region, for example, it can be formed with a width of less than 0.5 µm. The larger the width of the LDD region is, the more electric field intensity in the vicinity of the drain can be eased and hot-carrier injection is prevented, which is effective in preventing the deterioration phenomenon.

In addition, the LDD regions overlap the region with a small thickness of the gate electrode.

According to the invention, LDD regions having different widths are formed over the same substrate in a self-aligned manner and the width can be controlled precisely in accordance with each circuit.

BRIEF DESCRIPTION OF THE DRAWINGS

FIGS. 2A to 2E are top-plain views of an exposure mask and views showing light intensity distribution. (Embodiment Mode 2)

DETAILED DESCRIPTION OF THE INVENTION

Figure 1A:
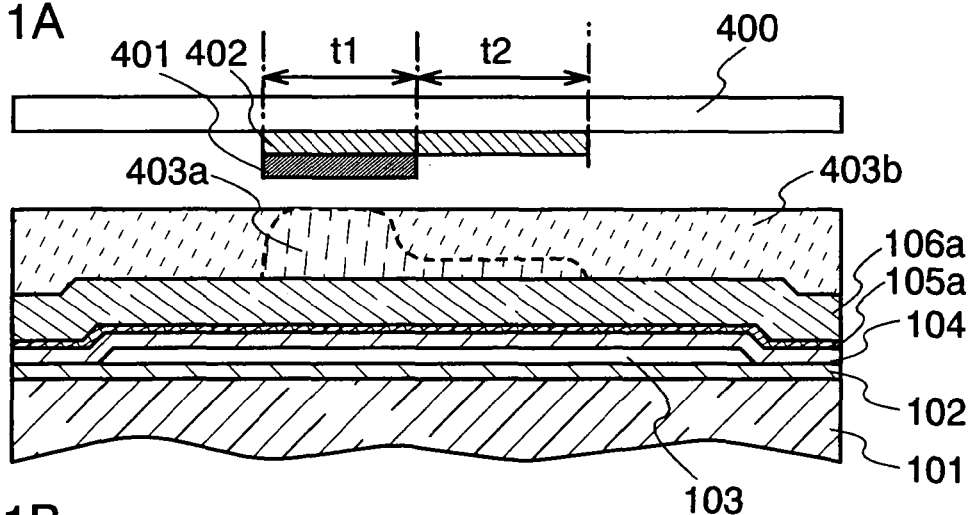
FIGS. 1A to 1D are cross-sectional views showing a manufacturing process of a semiconductor device. (Embodiment Mode 1)

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Embodiment Mode 1

This embodiment mode describes a process for forming low-concentration impurity regions having different widths respectively on both sides of a channel forming region in a self-aligned manner by using a gate electrode of a TFT as a mask in ion-doping.

First, a first insulating film (a base insulating film) 102 is formed over a substrate 101 having an insulating surface. As the substrate 101 having an insulating surface, a light-transmitting substrate such as a glass substrate, a crystallized glass substrate, or a plastic substrate can be used. In the case where a thin film transistor to be formed is applied to a top emission light-emitting display device or a reflective liquid crystal display device, a ceramic substrate, a semiconductor substrate, a metal substrate, or the like can also be used.

As the first insulating film 102, a single layer or a stacked-layer of an insulating film such as a silicon oxide film, a silicon nitride film, or a silicon oxynitride ($SiO_xN_y$) film. Next, a semiconductor layer 103 is formed over the first insulating film 102.

The semiconductor layer 103 is formed as follows: a semiconductor film having an amorphous structure is formed by a known method (e.g., a sputtering method, an LPCVD method, or a plasma CVD method); a crystalline semiconductor film that is crystallized by heat treatment is formed; a resist film is formed over the crystalline semiconductor film; and then using a first resist mask obtained by light exposure and development, the crystalline semiconductor film is patterned into a desired shape.

The semiconductor layer 103 is formed to have a thickness of 25 to 80 nm (preferably, 30 to 70 nm). There is no limitation on the material to be used for the crystalline semiconductor film, however, silicon or silicon germanium (SiGe) alloy or the like is preferably used.

As the heat treatment, a heating furnace, laser irradiation, irradiation of light emitted from a lamp instead of laser light (hereinafter referred to as lamp annealing), or a combination thereof can be used.

In addition, the crystalline semiconductor film may also be formed by a thermal crystallization method in which the above-described heat treatment is performed after adding a catalyst such as nickel. Note that in the case where the crystalline semiconductor film is obtained by the thermal crystallization method using a catalyst such as nickel, it is preferable to perform gettering treatment for removing the catalyst such as nickel after crystallization.

In addition, when the crystalline semiconductor film is formed by a laser crystallization method, a continuous wave oscillation laser beam (a CW laser beam) or a pulsed oscillation laser beam (a pulsed laser beam) can be used. As a laser beam that can be used here, a laser beam emitted from one or plural kinds of: a gas laser such as an Ar laser, a Kr laser, or an excimer laser; a laser using, as a medium, single crystal YAG, $YVO_4$, forsterite ($Mg_2SiO_4$), $YAlO_3$, or $GdVO_4$, or polycrystal (ceramics) YAG, $Y_2O_3$, $YVO_4$, $YAlO_3$, or $GdVO_4$ in which one or plural kinds of Nd, Yb, Cr, Ti, Ho, Er, Tm, and Ta is added as a dopant; a glass laser; a ruby laser; an alexandrite laser; a Ti: sapphire laser; a copper vapor laser; or a gold vapor laser, can be used. A crystal grain having a large diameter can be obtained by irradiation of the fundamental wave of the above laser beam or a second harmonic to a fourth harmonic of the fundamental wave. For example, the second harmonic (532 nm) or the third harmonic (355 nm) of a Nd: $YVO_4$ laser (fundamental wave: 1064 nm) can be used. At this time, energy density of the laser is required to be about 0.01 to 100 $MW/cm^2$ (preferably, 0.1 to 10 $MW/cm^2$). A scanning rate is set to be about 10 to 2000 cm/sec for irradiation.

It is to be noted that, as for the laser using, as a medium, single crystal YAG, $YVO_4$, forsterite ($Mg_2SiO_4$), $YAlO_3$, or $GdVO_4$, or polycrystal (ceramics) YAG, $Y_2O_3$, $YVO_4$, $YAlO_3$, or $GdVO_4$ in which one or plural kinds of Nd, Yb, Cr, Ti, Ho, Er, Tm, and Ta is added as a dopant; the Ar ion laser; and the Ti: sapphire laser, continuous wave oscillation can be performed. In addition, pulsed oscillation at a repetition frequency of 10 MHz or more can also be performed by carrying out a Q-switch operation, mode locking, or the like. In the case where a laser beam is oscillated at a repetition frequency of 10 MHz or more, after the semiconductor film is melted by a laser, it is irradiated with the next pulsed laser until it solidifies. Therefore, unlike in a case where a pulsed laser at a low repetition frequency is used, an interface between solid and liquid can be moved continuously in the semiconductor film, and thus, crystal grains which are grown continuously in a scanning direction can be obtained.

When ceramics (polycrystal) are used as a medium, a medium can be formed into a desired shape in a short time at a low cost. In a case of using a single crystal, generally, a medium with a columnar shape having a diameter of several mm and a length of several tens of mm is used. However, in a case of using ceramics, a larger medium can be formed.

The concentration of a dopant such as Nd or Yb in a medium, which directly contributes to light-emission, cannot be changed very much in either a single crystal or a polycrystal, therefore, improving laser output by increasing the concentration is limited to some extent. However, in the case of ceramics, a size of a medium can be extremely large compared with a single crystal, and thus, it can be expected that the output is improved drastically.

Furthermore, in the case of ceramics, a medium having a parallelepiped shape or a rectangular shape can be easily formed. When oscillation light goes in zigzag inside a medium by using a medium having such a shape, the oscillation light path can be made long. Therefore, the light is amplified largely and the laser can be emitted with large output. In addition, since the laser beam emitted from a medium having such a shape has a rectangle cross-sectional shape, it is easier to shape a linear beam than the case of a circular beam. By shaping the laser beam emitted as described above using an optical system, a linear beam having a length of 1 mm or less on a short side and a length of several mm to several m on a long side can be easily obtained. Further, by uniformly irradiating the medium with excited light, the linear beam has uniform energy distribution in a long side direction.

By irradiating the semiconductor film with this linear beam, the entire surface of the semiconductor film can be more uniformly annealed. In the case where annealing by linear beam with uniformity between both ends thereof is required, there requires a device, such as to provide a slit on both the ends so as to shield light at a portion where energy is decayed.

When the linear beam with uniform intensity obtained as described above is used for annealing the semiconductor film and electronic equipment is manufactured using the semiconductor film, characteristics of the electronic equipment can be favorable and uniform.

Subsequently, if necessary, doping with a small amount of impurity element (boron or phosphorus) is performed to the semiconductor layer to control the threshold value of a TFT. Here, an ion doping method in which diborane ($B_2H_6$) is not mass separated but excited by plasma is used.

Then, after the first resist mask is removed, an oxide film is removed with an etchant containing hydrofluoric acid and the surface of the semiconductor layer is cleaned at the same time. Thereafter, a second insulating film (gate insulating film) 104 covering the semiconductor layer is formed. The second insulating film 104 is formed using a plasma CVD method, a sputtering method, or a thermal oxidation method with a thickness of 1 to 200 nm and preferably 70 to 120 nm. As the second insulating film 104, a film formed of an insulating film such as a silicon oxide film, a silicon nitride film, or a silicon oxynitride film is formed. Here, a silicon oxynitride film (where composition ratio is: Si=32%, O=59%, N=7%, and H=2%) is formed with a thickness of 115 nm by a plasma CVD method.

In addition, after forming a substrate, an insulating layer as a base film, a semiconductor layer, a gate insulating layer, an interlayer insulating layer, or the like, oxidation or nitridation may be performed by plasma treatment to oxidize or nitride respective surfaces of the substrate, the insulating layer as a base film, the semiconductor layer, the gate insulating layer, the interlayer insulating layer, or the like. When the semiconductor layer or the insulating layer is oxidized or nitrided using plasma treatment, the surface of the semiconductor layer or the insulating layer is reformed, and a more dense insulating film compared with an insulating film formed by a CVD method or a sputtering method can be formed. Therefore, a defect such as a pin hole is suppressed and properties or the like of a semiconductor device can be improved. In addition, such plasma treatment can also be performed to a gate electrode layer, a source electrode layer, a drain electrode layer, a wiring layer, or the like and by performing nitridation or oxidation, a nitride film or an oxide film can be formed.

Note that, when the film is oxidized by plasma treatment, the plasma treatment is performed under an oxygen atmosphere (e.g., under an atmosphere of oxygen ($O_2$) and a rare gas (containing at least one of He, Ne, Ar, Kr and Xe), under an atmosphere of oxygen, hydrogen ($H_2$), and a rare gas, or under an atmosphere of dinitrogen monoxide and a rare gas)). On the other hand, when the film is nitrided by plasma treatment, the plasma treatment is performed under a nitrogen atmosphere (e.g., under an atmosphere of nitrogen ($N_2$) and a rare gas (containing at least one of He, Ne, Ar, Kr and Xe), under an atmosphere of nitrogen, hydrogen, and a rare gas, or under an atmosphere of $NH_3$ and a rare gas). As the rare gas, for example, Ar can be used. Further, a mixed gas of Ar and Kr may also be used. Therefore, the insulating film formed by plasma treatment contains the rare gas (containing at least one of He, Ne, Ar, Kr and Xe) used in the plasma treatment, and the insulating film contains Ar in the case of using Ar.

In addition, when plasma treatment is performed to the second insulating film 104, the plasma treatment is performed under an atmosphere of the above described gas where electron density is $1 \times 10^{11}$ cm$^{-3}$ or higher and electron temperature of plasma is 1.5 eV or lower. More specifically, it is performed where the electron density is in the range of $1 \times 10^{11}$ cm$^{-3}$ to $1 \times 10^{13}$ cm$^{-3}$ and the electron temperature of plasma is in the range of 0.5 eV to 1.5 eV. Since the electron density of plasma is high and the electron temperature in the vicinity of an object to be processed (here, the second insulating film 104 functioning as a gate insulating layer) formed over the substrate is low, damage due to plasma to the object to be processed can be prevented. Further, because of the high electron density of plasma which is $1 \times 10^{11}$ cm$^{-3}$ or higher, the oxide film or the nitride film, which is formed by oxidizing or nitriding the object to be processed using the plasma treatment, has excellent uniformity in thickness or the like and dense film quality as compared with a film formed by a CVD method, a sputtering method, or the like. In addition, because of the low electron temperature of plasma which is 1.5 eV or lower, oxidizing or nitriding treatment can be performed at a low temperature as compared with conventional plasma treatment or a thermal oxidation method. For example, oxidizing or nitriding treatment can be sufficiently performed even by plasma treatment at a temperature that is lower than a strain point of a glass substrate by 100° C. or more. Note that as a frequency for forming plasma, a high frequency wave such as a microwave (2.45 GHz) can be used. Hereinafter, the above conditions are used for plasma treatment if not otherwise mentioned.

Next, a stacked-layer of a first conductive layer 105a and a second conductive layer 106a is formed. Note that the stacked-layer is not limited to two layers of the first conductive layer and the second conductive layer, and three or more layers may also be stacked.

The first conductive layer is formed of refractory metal such as tungsten (W), chromium (Cr), tantalum (Ta), tantalum nitride (TaN), or molybdenum (Mo), or alloy or a compound containing the refractory metal as a main component with a thickness of 20 to 50 nm. In addition, the second conductive layer is formed of the refractory metal such as tungsten (W), chromium (Cr), tantalum (Ta), tantalum nitride (TaN), or molybdenum (Mo), or the alloy or the compound containing the refractory metal as a main component with a thickness of 200 to 600 nm.

Here, two layers, that is, the first conductive layer and the second conductive layer are formed of different conductive materials to each other, so that there is difference in etching rate in an etching step that is carried out later. TaN is used for the first conductive layer, and a tungsten film is used as the second conductive layer.

Subsequently, after a resist film is coated over the entire surface of the second conductive layer 106a, light exposure is performed using a mask shown in FIG. 1A. Here, a resist film with a thickness of 1.5 µm is coated, and a light exposure machine in which resolution is 1.5 µm is used for the light exposure. Light used for the light exposure is an i-line (wavelength: 365 nm), and exposure energy is selected from a range of 70 to 140 mJ/cm$^2$. In addition, the light is not limited to an i-line; light in which an i-line, a g-line (wavelength: 436 nm) and an h-line (wavelength: 405 nm) are mixed may also be used for the light exposure.

In FIG. 1A, for the exposure mask 400, a light shielding portion 401 formed of a metal film such as Cr and a portion 402 provided with a semi-transparent film (also called a "semi-transparent portion") as an auxiliary pattern having a light intensity reduction function are provided. In a cross-sectional view of the exposure mask, the width of the light shielding portion 401 is denoted by t1, and the width of the portion 402 provided with only the semi-transparent film is denoted by t2. An example of using the semi-transparent film as part of the exposure mask is described here, however, a diffraction grating pattern may also be used.

When light exposure is performed to the resist film by using the exposure mask shown in FIG. 1A, a non-exposed region 403a and an exposed region 403b are formed. In the light exposure, the exposed region 403b shown in FIG. 1A is formed by light that is gone around into the light shielding portion 401 or passed through the portion 402 provided with the semi-transparent film.

Figure 1B:
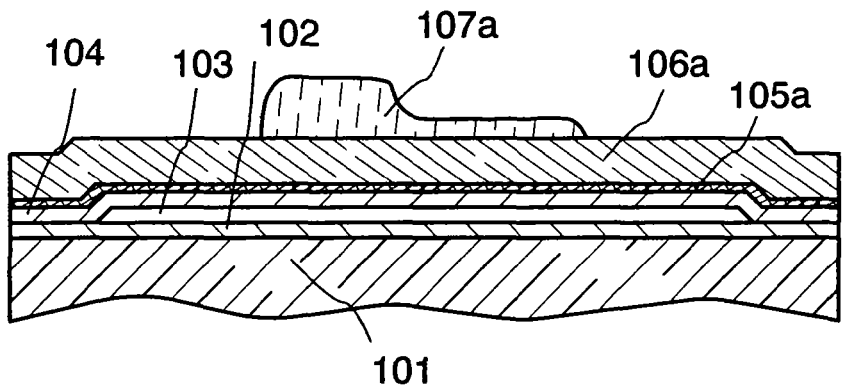

Then, development is performed to remove the exposed region 403b, so that, as shown in FIG. 1B, a left-right asymmetrical resist pattern 107a having a region with a large thickness and a region with a thickness smaller than that of the above region respectively on both sides can be obtained over the second conductive layer 106a. Here, 'left-right asymmetric' means to be left-right asymmetric with respect to a center line in the cross-sectional view shown in FIG. 1B. In the left-right asymmetrical resist pattern 107a, the thickness of the resist film in the region with a small thickness can be adjusted by adjusting the exposure energy.

Then, etching of the second conductive layer 106a and the first conductive layer 105a is performed by dry etching. As the etching gas, $CF_4$, $SF_6$, $Cl_2$, or $O_2$ is used. A dry etching apparatus using a high-density plasma source such as ECR (Electron Cyclotron Resonance) or ICP (Inductively Coupled Plasma) is used to improve the etching rate. Note that, depending on the etching condition, the second insulating film 104 is also etched so that the thickness becomes partially small.

Note that although an example of using an ICP etching apparatus is described here, the invention is not particularly limited, and for example, a parallel-plate etching apparatus, a magnetron etching apparatus, an ECR etching apparatus, a hericon etching apparatus, or the like may also be employed. In addition, the invention is not limited to dry etching, and wet etching may also be employed. Further, both of dry etching and wet etching may also be employed in combination.

Figure 1C:
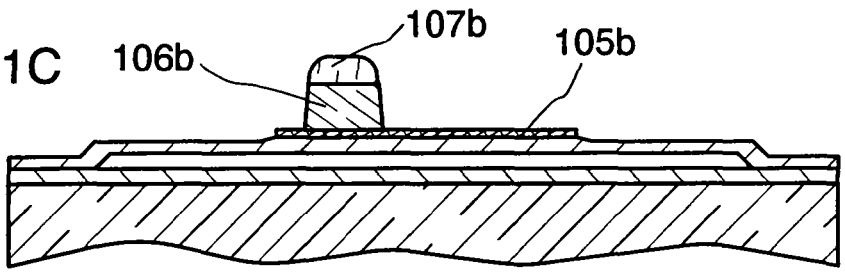

In this manner, as shown in FIG. 1C, a conductive stacked-layer pattern constituted by the first conductive layer 105b and the second conductive layer 106b is formed over the second insulating film 104. By etching, both side walls of the first conductive layer 105b are exposed, and further, a region which is not overlapped with the second conductive layer 106b is exposed. Note that both the side walls of the first conductive layer 105b may have a taper shape. Further, both side walls of the second conductive layer 106b may also have a taper shape.

Next, after a resist pattern 107b is removed, one conductivity type impurity is added into the semiconductor layer 103. Here, phosphorus (or As) is used as an ion of the one conductivity type impurity, and an n-channel TFT is manufactured. By using the conductive stacked-layer pattern, an LDD region, a source region or a drain region can be formed in a self-aligned manner without forming a sidewall.

When doping treatment for forming a source region and a drain region provided outside the gate electrode is performed, an ion of one conductivity type impurity may be added into the semiconductor layer 103 with the conductive stacked-layer pattern as a mask to form high-concentration, one conductivity type impurity regions 110 and 111. The doping for forming the source region and the drain region is carried out in a condition in which the accelerating voltage is 30 kV or less. The impurity concentration of the high-concentration, one conductivity type impurity regions 110 and 111 is set to be $1\times10^{19}$ to $5\times10^{21}/cm^3$ (: the peak value by a SIMS measurement).

In addition, when doping treatment for forming an LDD region overlapped with the gate electrode is performed, an ion of one conductivity type impurity may be added into the semiconductor layer 103 through the first conductive layer 105b in a region which is not overlapped with the second conductive layer, to form low-concentration, one conductivity type impurity regions 109a and 109b. In this case, the doping requires a condition in which the accelerating voltage is 50 kV or more, through depending on the thickness of the second insulating film or the first conductive layer. The impurity concentration of the low-concentration, one conductivity type impurity regions 109a and 109b is set to be $1\times10^{16}$ to $5\times10^{18}/cm^3$ (: the peak value by a SIMS measurement), provided that they are LDD regions.

Note that the order of doping is not particularly limited, and after performing doping treatment for forming a source region and a drain region, doping treatment for forming an LDD region may be performed. To the contrary, after performing doping treatment for forming an LDD region, doping treatment for forming a source region and a drain region may be performed.

In addition, although the example in which doping treatment is performed twice separately to form impurity regions with different concentrations is described here, the impurity regions with different concentrations may be formed by one doping treatment by adjusting the treatment condition.

In addition, although the example in which a resist pattern is removed before doping is described here, the resist pattern may also be removed after the doping treatment. When doping is performed with a resist pattern left, the doping can be performed while protecting the surface of the second conductive layer with the resist pattern.

Note that, in the case of the above-described doping treatment, the semiconductor layer in a position overlapped with the second conductive layer is to be a region into which the ion of the one conductivity type impurity is not added and functions as a channel forming region of a TFT which is to be formed.

In addition, the conductive stacked-layer pattern (the first conductive layer 105b and the second conductive layer 106b) in a portion intersected with the semiconductor layer 103 becomes a gate electrode. A region of the first conductive layer 105b, which is not overlapped with the second conductive layer 106b, is the length of a Lov region. Note that a Lov region means a low-concentration impurity region overlapped with the gate electrode. The necessary length of the Lov region may be determined in accordance with the kind or intended purpose of a circuit including the TFT, and based on the length, the exposure mask or the etching condition may be set.

After that, a third insulating film 112 using silicon nitride is formed. Then, activation and hydrogenation of the impurity element added into the semiconductor layer are performed.

Next, a fourth insulating film 113 is formed using a light-transmitting inorganic material (e.g., silicon oxide, silicon nitride, or silicon oxynitride) or a low-dielectric constant, organic compound material (e.g., a photosensitive or non-photosensitive organic resin material). In addition, the fourth insulating film may also be formed using a material containing siloxane. Note that siloxane is a material including a skeleton structure formed by a bond of silicon (Si) and oxygen (O). As a substituent, an organic group containing at least hydrogen (e.g., an alkyl group or aromatic hydrocarbon) is used. Alternatively, a fluoro group may also be used as the substituent. Further alternatively, both of an organic group containing at least hydrogen and a fluoro group may be used as the substituent.

Then, a mask of resist is formed using a third photomask, and the third insulating film 112 functioning as an interlayer insulating film, the fourth insulating film 113, and the second insulating film 104 functioning as a gate insulating film are selectively etched to form a contact hole. After that, the mask of resist is removed.

Then, after a metal stacked-layer film is formed by a sputtering method over the fourth insulating film 113, a mask of resist is formed using a fourth photomask, and the metal stacked-layer film is selectively etched to form source and drain electrodes 114 and 115 which are in contact with the semiconductor layer.

Note that a connection electrode (electrode for electrically connecting plural TFTs) or a terminal electrode (electrode for connecting to an external power supply) can also be formed at the same time as the source and drain electrodes 114 and 115 of a TFT over the fourth insulating film 113. Then, the mask of resist is removed. Note that the metal stacked-layer film has a stacked structure of three layers, a Ti film with a thickness of 100 nm, an Al film containing a small amount of Si with a thickness of 350 nm, and a Ti film with a thickness of 100 nm. It is preferable to form the metal stacked-layer film continuously in the same metal sputtering apparatus.

Figure 1D:
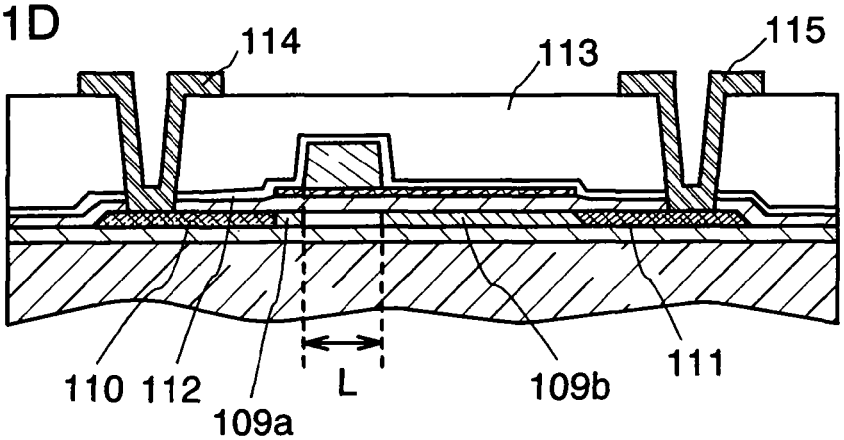

Through the above steps, as shown in FIG. 1D, a top gate TFT having the low-concentration impurity region 109a with a small width on one side of the channel forming region, and the low-concentration impurity region 109b with a large width on the other side of the channel forming region are formed. In addition, a channel length L is shown in FIG. 1D.

As described above, in this embodiment mode, light exposure is performed by using a photomask provided with an auxiliary pattern having a light intensity reduction function formed of a diffraction grating pattern or a semi-transparent film to form the left-right asymmetrical resist pattern 107a, and by using the resist pattern 107a, the left-right asymmetrical gate electrode is obtained.

Therefore, by adjusting the length of a portion where the thickness of the resist pattern 107a is small, the respective lengths of the two Lov regions can be adjusted in a self-aligned manner.

For example, in a case of forming an n-channel TFT used for a buffer circuit, the channel length L can be 10 µm, the length of one Lov region can be 0.5 µm, and the length of the other Lov region can be 1.5 µm. In this case, the gate electrode width, that is, the width of the conductive stacked-layer pattern (the width in a channel length direction) is 12 µm.

Although the description is made using an n-channel TFT in this embodiment mode, a p-channel TFT can also be formed by using a p-type impurity element instead of an n-type impurity element.

Further, an n-channel TFT and a p-channel TFT can be formed over the same substrate, and by combining these TFTs complementarily, a CMOS circuit can be formed. The CMOS circuit means a circuit having at least one n-channel TFT and one p-channel TFT (e.g., an inverter circuit, a NAND circuit, an AND circuit, a NOR circuit, an OR circuit, a shift register circuit, a sampling circuit, a D/A converter circuit, an A/D converter circuit, a latch circuit, or a buffer circuit). In addition, by combining these CMOS circuits, a memory element such as an SRAM or a DRAM or the other element can be constituted over the substrate. Further, a CPU can also be constituted over the substrate by integrating various elements or circuits.

In addition, a top gate TFT with the above structure (the structure having Lov regions with a large width and with a small width respectively on both side of the channel forming region) and a top gate TFT with a structure having Lov regions with the same widths respectively on both sides of the channel forming region can be formed over the same substrate only by changing an exposure mask without increasing the number of steps.

In addition, although the description is made using a top gate TFT with a single gate structure in this embodiment mode, a top gate TFT with a multi-gate structure having a plurality of channel forming regions can also be formed. In addition, a top gate TFT with a single gate structure and a top gate TFT with a multi-gate structure can be formed over the same substrate only by changing an exposure mask without increasing the number of steps.

Accordingly, various circuits can be constituted by assigning transistors with appropriate structures over the same substrate without increasing the number of steps.

Embodiment Mode 2

In this embodiment mode, an exposure mask provided with an auxiliary pattern having a light intensity reduction function formed of a diffraction grating pattern or a semi-transparent film, which is used in Embodiment Mode 1, is described with reference to FIGS. 2A to 2E.

Note that FIG. 1A is a cross-sectional view of an exposure mask. Similarly, also in FIGS. 2A to 2E, the width of a light shielding portion is denoted by t1 and the width of a portion provided with an auxiliary pattern is denoted by t2.

As specific examples of the auxiliary pattern, FIGS. 2A and 2B show part of top-plane views of an exposure mask provided with a diffraction grating pattern having a slit portion formed of a line and a space at or below the resolution limit of an exposure apparatus. Diffraction grating pattern is a pattern in which at least one pattern of a slit, a dot, or the like is provided. In the case where a plurality of patterns of a slit, a dot, or the like is provided, they may be provided either periodically or unperiodically. By using micropattern at or below the resolution limit, the substantive exposure amount can be changed, and the film thickness after the exposured resist is developed can be adjusted.

A slit direction of the slit portion may be parallel to a direction of a main pattern (a light shielding portion 202) like a slit portion 203, or may be perpendicular to a direction of a main pattern (a light shielding portion 206) like a slit portion 207. Note that, since it is difficult to employ a negative type resist as the resist used in this photolithography step, the pattern structure of a photomask or a reticle for forming a gate electrode is based on a positive type resist.

When a photomask or a reticle 201 or 205 for forming a gate electrode is irradiated with exposure light, the light intensity is approximately zero in the light shielding portion 202 or 206 and the light intensity is approximately 100% in a light transmitting portion 204 or 208. On the other hand, the light intensity of the auxiliary pattern having a light intensity reduction function formed of the slit portion 203 or 207 of the diffraction grating pattern formed of a line or a space at or below the resolution limit of an exposure apparatus, can be adjusted in the range of 10 to 70%. A typical example of the light intensity distribution is shown by a light intensity distribution 209 in FIG. 2C. Adjustment of the light intensity of the slit portion 203 or 207 in the diffraction grating pattern can be realized by adjustment of the pitch and the slit width of the slit portion 203 or 207.

In addition, as a specific example of the auxiliary pattern, FIG. 2D shows part of a top-plane view of an exposure mask provided with a semi-transparent portion formed of a semi-transparent film having a light intensity reduction function of exposure light. As the semi-transparent film, as well as MoSiN, MoSi, MoSiO, MoSiON, CrSi or the like can be used. Exposure method using an exposure mask provided with a semi-transparent portion is also called a half-tone exposure method.

A region of a main pattern of a mask pattern for forming a gate electrode in a photomask or a reticle 210 for forming a gate electrode is a light shielding portion 211, a region of an auxiliary pattern having a light intensity reduction function is a semi-light transmitting portion 212 formed of a semi-transparent film, and a region outside the semi-light transmitting portion 212 is a light transmitting portion 213.

In addition, when the photomask or reticle 210 for forming a gate electrode is irradiated with exposure light, the light intensity is approximately zero in the light shielding portion 211, the light intensity is approximately 100% in the light transmitting portion 213, and the light intensity of the auxiliary pattern formed of the semi-light transmitting portion 212 formed of a semi-transparent film can be adjusted in the range of 10 to 70%. A typical example of the light intensity distribution is shown by a light intensity distribution 214 in FIG. 2E.

In addition, this embodiment mode can be freely combined with Embodiment Mode 1.

Embodiment Mode 3

A method for forming the conductive stacked-layer pattern described in Embodiment Mode 1 is not particularly limited. Here, an example of forming a conductive stacked-layer pattern by changing the etching condition several times during a process is described with reference to FIGS. 3A to 3F.

Figure 3A:
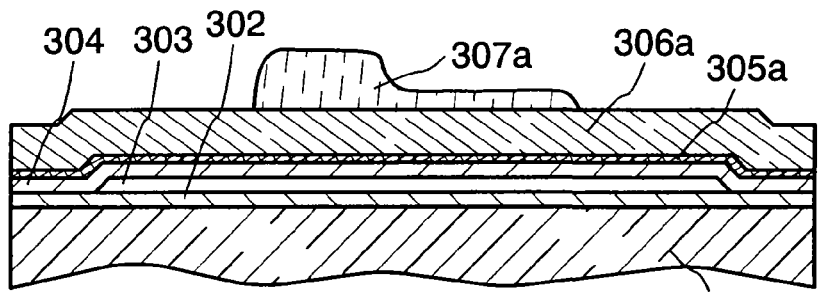
FIGS. 3A to 3F are cross-sectional views showing a manufacturing process of a semiconductor device. (Embodiment Mode 3)

First, similarly to Embodiment Mode 1, a resist pattern 307a is formed over a second conductive layer 306a. FIG. 3A corresponds to FIG. 1B.

Note that in FIG. 3A, over a substrate 301, a first insulating film (base insulating film) 302, a semiconductor layer 303, and a second insulating film (gate insulating film) 304 are formed, and over that, a first conductive layer 305a and the second conductive layer 306a are formed.

Figure 3B:
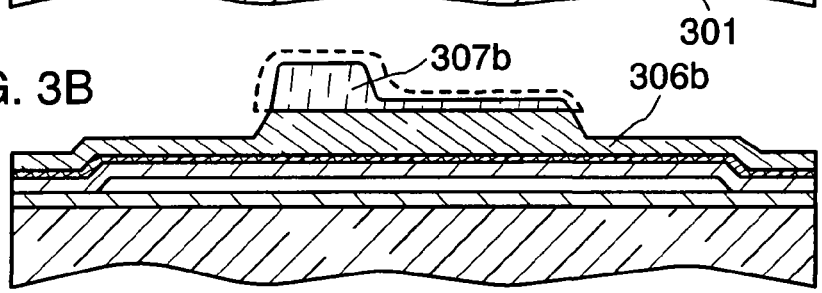

Then, etching is performed in a first etching condition so that the resist pattern 307b and the second conductive layer 306b are formed with a shape shown in FIG. 3B. A tapered portion is formed in a part of the second conductive layer 306b in the first etching condition.

Figure 3C:
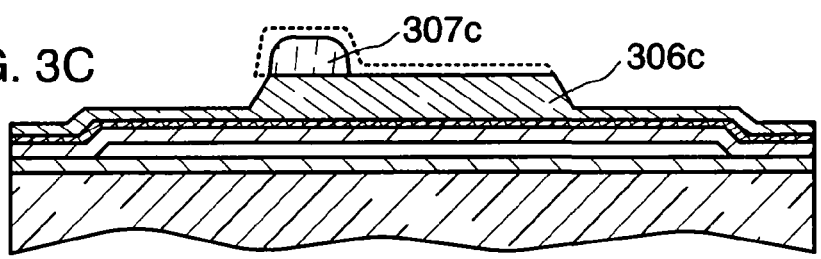

Next, the etching in the first etching condition continues to obtain a state of FIG. 3C. In this stage, a resist pattern 307c having no step is obtained. In addition, while forming a tapered portion in a part of a second conductive layer 306c, film thickness is decreased.

Figure 3D:
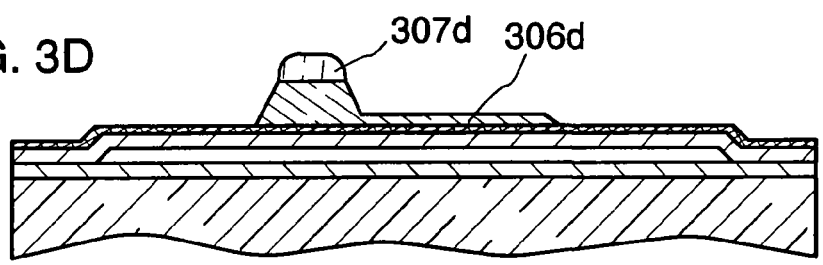
Figure 3E:
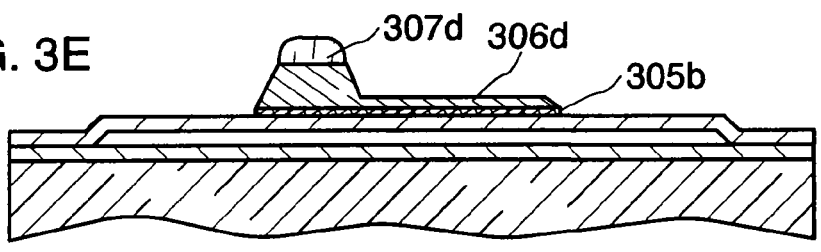
Figure 3F:
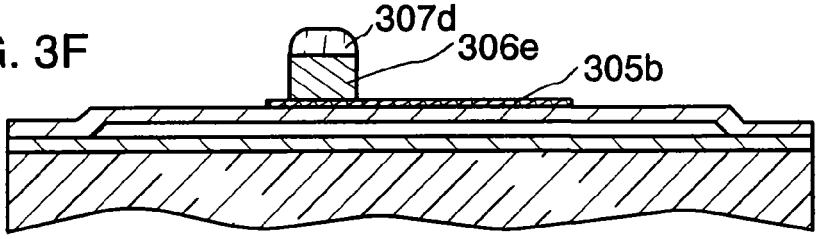

Then, the etching in the first etching condition continues to obtain a state of FIG. 3D. Furthermore, the resist pattern is reduced in size to obtain a resist pattern 307d. In addition, a second conductive layer 306d with an L-shape is obtained to expose a part of the first conductive layer 305a.

Then, etching in a second etching condition is performed using the second conductive layer 306d with an L-shape as a mask, to form a first conductive layer 305b.

Subsequently, anisotropic etching is performed in a third etching condition to form a second conductive layer 306e. In this anisotropic etching, it is important that a difference in etching rate is large between the first conductive layer and the second conductive layer, and preferably, different conductive materials may be used for the first conductive layer and the second conductive layer. In addition, by adjusting the third etching condition, it is also possible to prevent the second insulating film from being partially thin due to this anisotropic etching.

As described above, by forming the conductive stacked-layer pattern while finely changing the etching condition, variations in the shape of the conductive stacked-layer pattern can be suppressed.

Subsequent steps are the same as in Embodiment Mode 1, therefore, detailed description is omitted here.

In addition, this embodiment mode can be freely combined with Embodiment Mode 1 or 2.

Embodiment Mode 4

Figure 4A:
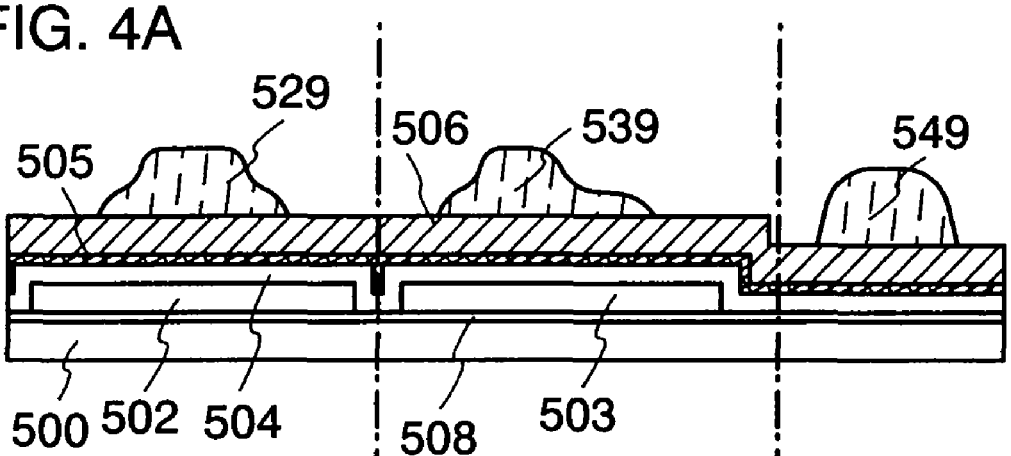
FIGS. 4A to 4C are cross-sectional views showing a manufacturing process of a semiconductor device. (Embodiment Mode 4)
Figure 4B:
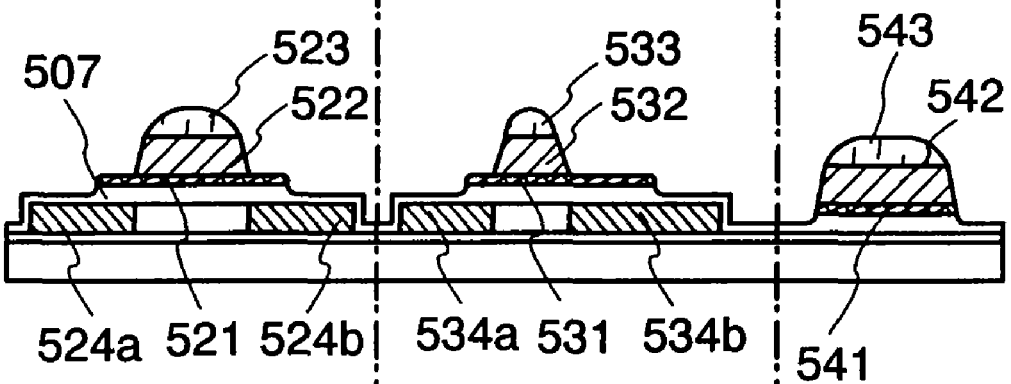
Figure 4C:
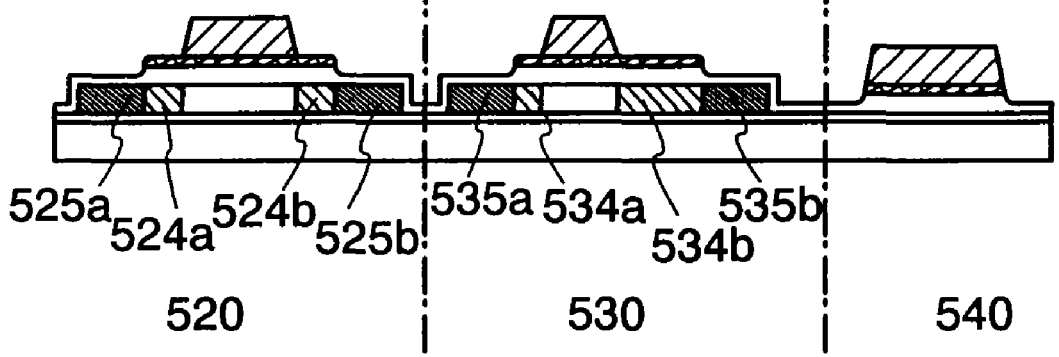

In this embodiment mode, an example of forming a top gate TFT with the above structure (structure having a Lov region with a wide larger on the drain side than that of a Lov region on the source side) and a top gate TFT with a structure having Lov regions with the same widths on both sides of the channel forming region, over the same substrate only by changing an exposure mask without increasing the number of manufacturing steps with reference to FIGS. 4A to 4C.

In FIG. 4A, semiconductor layers 502 and 503 are formed over a substrate 500 and an insulating layer 508. A gate insulating layer 504, a first conductive film 505, and a second conductive film 506 are formed to cover the semiconductor layers 502 and 503, and resist patterns 529, 539, and 549 having different shapes as shown in FIG. 4A are formed. These resist patterns can be formed by using the exposure mask as described in Embodiment Mode 1 or 2.

The resist pattern 529 has a shape with gentle steps on both sides thereof (a left-right symmetrical shape in a cross-section of FIG. 4A), the resist pattern 539 has a shape with a convex portion in a position which is shifted from a center thereof (a left-right asymmetrical shape in the cross-section of FIG. 4A), and the resist pattern 549 has a shape without a step, concavity and convexity (a left-right symmetrical shape in the cross-section of FIG. 4A).

Patterning is performed by etching treatment with the resist patterns 529, 539, and 549, to form a first gate electrode layer 521, a second gate electrode layer 522, a first gate electrode layer 531, a second gate electrode layer 532, a first wiring layer 541, and a second wiring layer 542.

An impurity element having one conductivity type is added into the semiconductor layers 502 and 503 with the second gate electrode layers 522 and 532 as a mask to form low-concentration impurity regions 524a, 524b, 534a, and 534b (see FIG. 4B).

Further, an impurity element having one conductivity type is added into the semiconductor layers 502 and 503 with the first gate electrode layer 521, the second gate electrode layer 522, the first gate electrode layer 531, and the second gate electrode layer 532 as a mask to form high-concentration impurity regions 525a, 525b, 535a, and 535b.

Then, resist patterns 523, 533, and 543 are removed.

In this manner, a first TFT portion 530, a second TFT portion 520, and a wiring portion 540 can be formed over the same substrate. A TFT having the low-concentration impurity region 534a on the source side and the low-concentration impurity region 534b on the drain side is formed in the first TFT portion 530. Note that the width of the low-concentration impurity region 534b is larger than that of the low-concentration impurity region 534a. A TFT having the low-concentration impurity regions 524a and 524b with the same widths on both sides of the channel forming region is formed in the second TFT portion 520 (see FIG. 4C). In addition, a stacked-layer in which the end portion is in alignment, that is, a stacked-layer of the first wiring layer 541 and the second wiring layer 542 is obtained in the wiring portion 540.

Figure 12:
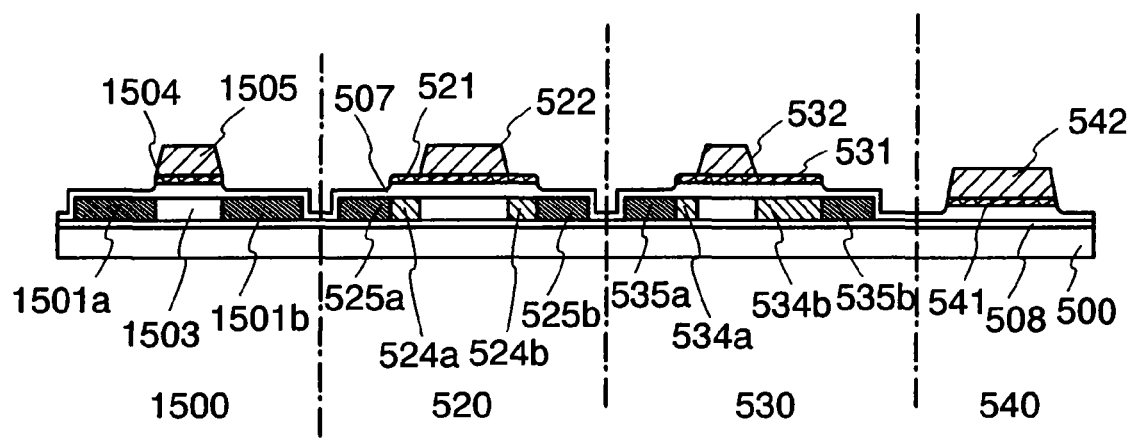
FIG. 12 is a cross-sectional view showing a manufacturing process of a semiconductor device. (Embodiment Mode 4)

Further, a TFT with a single drain structure can also be formed over the same substrate. An example thereof is shown in a cross-sectional view of FIG. 12. Note that the same portions as those in FIG. 4C are denoted by the same reference numerals. In FIG. 12, the first TFT portion 530, the second TFT portion 520, a third TFT portion 1500, and the wiring portion 540 are formed over the substrate 500. In the third TFT portion 1500 where a TFT with a single drain structure is provided, a first gate electrode layer 1504 and a second gate electrode layer 1505 are a stacked-layer in which respective end portions are in alignment like the stacked-layer of the first wiring layer 541 and the second wiring layer 542. In addition, the first gate electrode layer 1504 is formed of the same material as the first wiring layer 541 or the first gate electrode layer 521, and the second gate electrode layer 1505 is formed of the same material as the second wiring layer 542 or the second gate electrode layer 522. By adding an impurity element which has one conductivity type, with the first gate electrode layer 1504 and the second gate electrode layer 1505 as a mask, high-concentration impurity regions 1501a and 1501b are formed in a self-aligned manner, and a channel forming region 1503 is formed between the high-concentration impurity regions 1501a and 1501b. Comparing with the TFTs shown in the first TFT portion and the second TFT portion, the TFT with a single drain structure shown in the third TFT portion 1500 has a structure suitable for high-speed operation. As described above, the top gate TFT with the above structure (structure having a Lov region with a wide larger on the drain side than that of a Lov region on the source side), the top gate TFT with the above structure having Lov regions with the same widths respectively on both sides of the channel forming region, and the TFT with a single drain structure can be formed over the same substrate.

In addition, by using the same resist pattern, the same structure as the first TFT portion 530 is formed so that a capacitor and a TFT can be formed over the same substrate. In that case, a capacitor in which the gate insulating layer 504 is a dielectric, and the high-concentration impurity regions 535a and 535b, and the first gate electrode layer 531 and the second gate electrode layer 532 are a pair of electrodes can also be formed.

In addition, this embodiment mode can be freely combined with Embodiment Mode 1, 2, or 3.

Embodiment Mode 5

In this embodiment mode, a structure of an active matrix light-emitting device is described hereinafter with reference to FIGS. 5 and 6 along with a manufacturing method thereof.

First, a base insulating film 611 is formed over a substrate 610 having an insulating surface. In the case where light-emission is extracted with the substrate 610 side as a display surface, a glass substrate or a quartz substrate having a light-transmitting property may be used as the substrate 610. Further, a light-transmitting plastic substrate having a heat resistance which can resist the processing temperature may also be used. On the other hand, in the case where light-emission is extracted with an opposite surface to the substrate 610 side as a display surface, a silicon substrate, a metal substrate, or a stainless steel substrate covered with an insulating film may also be used as well as the above substrates. Here, a glass substrate is used as the substrate 610. Note that the refractive index of a glass substrate is around 1.55.

As a base insulating film 611, a base film formed of an insulating film such as a silicon oxide film, a silicon nitride film, or a silicon oxynitride film is formed. Here, although an example in which a single layer structure is employed for the base film, a structure of stacking two or more of the insulating layers may also be employed. It is to be noted that the base insulating film is not required to be formed in the case where concavity and convexity of the substrate and impurity diffusion from the substrate are considered a non-issue.

Subsequently, a semiconductor layer is formed over the base insulating film. The semiconductor layer is formed as follows: after a semiconductor film having an amorphous structure is formed by a known method (e.g., a sputtering method, an LPCVD method, or a plasma CVD method), known crystallization treatment (e.g., a laser crystallization method, a thermal crystallization method, or a thermal crystallization method using a catalyst such as nickel) is performed to obtain a crystalline semiconductor film, and patterning is performed into a desired shape by using a first photomask. Note that the base insulating film and the semiconductor film having an amorphous structure can be stacked continuously without being exposed to atmospheric air by using a plasma CVD method. This semiconductor film is formed with a thickness of 25 to 80 nm (preferably 30 to 70 nm). A material for the crystalline semiconductor film is not particularly limited, but preferably, silicon or silicon-germanium (SiGe) alloy may be used.

Here, as a technique for crystallizing the semiconductor film having an amorphous structure, a technique disclosed in Japanese Patent Laid-Open No. Hei 8-78329 is used to crystallize. According to the technique disclosed in this publication, a metal element which promotes crystallization is selectively added to the amorphous silicon film, and heat treatment is performed so that a semiconductor film having a crystal structure expanding from the added region is formed.

Hereinafter, one example of a forming method of a crystalline semiconductor film is described in detail.

First, a nickel acetate solution containing a metal element having catalysis for promoting crystallization (here, nickel) at 1 to 100 ppm in weight is coated using a spinner on the surface of the semiconductor film having an amorphous structure, to form a nickel-containing layer. As an alternative method for forming the nickel-containing layer other than the coating, a method for forming an extremely thin film by a sputtering method, an evaporation method or plasma treatment may be employed. In addition, although the example of coating on the entire surface is described here, the nickel-containing layer may also be selectively formed by using a mask.

Then, heat treatment is performed for crystallization. In this case, a silicide is formed in a portion of the semiconductor film that is in contact with the metal element for promoting crystallization of the semiconductor, and crystallization is progressed by using the silicide as a nucleus. In this manner, a semiconductor film having a crystal structure is formed. Note that the concentration of oxygen contained in the semiconductor film after the crystallization is desirably $5 \times 10^{18}$/cm$^3$ or less. Here, after performing heat treatment for dehydrogenation (500° C. for 1 hour), heat treatment for crystallization (550 to 650° C. for 4 to 24 hours) is performed. In addition, in a case of performing crystallization by intense light irradiation, any one of infrared light, visible light and ultraviolet light, or combination thereof can be used. Note that, if necessary, heat treatment for discharging hydrogen contained in the semiconductor film having an amorphous structure may be performed before the intense light irradiation. Alternatively, heat treatment and intense light irradiation may be performed at the same time for crystallization. In view of productivity, crystallization is desirably performed by intense light irradiation.

In the crystalline semiconductor film obtained in such a manner, the metal element (here, nickel) remains. Although the metal element is not uniformly distributed in the film, it remains at a concentration over $1 \times 10^{19}$/cm$^3$ on average. Needless to say, various semiconductor elements such as a TFT can be formed even in such state; however, the metal element is removed by performing a gettering method as is described below.

Here, a natural oxide film formed in the crystallization step is removed before laser light irradiation. This natural oxide film which contains nickel at a high concentration is preferably removed.

Then, in order to increase the degree of crystallization (degree of the crystallized component in the total volume of the film) and compensate defects remaining in the crystal grains, the crystalline semiconductor film is irradiated with laser light. In a case of irradiating the crystalline semiconductor film with laser light, distortion or a ridge is formed in the semiconductor film and a thin surface oxide film (not shown) is formed over the surface. As this laser light, an excimer laser light with a wavelength of 400 nm or less that is emitted from a laser light source as a pulse oscillator, or the second or third harmonic of a YAG laser may be employed. Alternatively, the second to fourth harmonics of the fundamental wave may be employed using a solid-state laser capable of continuous wave oscillation. Typically, the second harmonic (532 nm) or the third harmonic (355 nm) of an Nd: YVO$_4$ laser (fundamental wave: 1064 nm) may be employed.

Subsequently, in order to reduce the distortion of the crystalline semiconductor film, first heat treatment (heat treatment of heating the semiconductor film until about 400 to 1000° C. momentarily) is performed in a nitrogen atmosphere, to obtain a flat semiconductor film. As the heat treatment of heating momentarily, heat treatment by intense light irradiation or heat treatment in which the substrate is put into a heated gas and after a few minutes, the substrate is taken out may be employed for heating. Depending on the condition of the heat treatment, as well as the distortion is reduced, the defect remained in the crystal grains are compensated, that is, improvement of crystallinity can be carried out. Further, by this heat treatment, the distortion is reduced, so that nickel can be easily gettered in a subsequent gettering step. Note that, when the temperature in the heat treatment is lower than the temperature in crystallization, nickel moves into a silicon film with a solid phase state kept.

Then, a semiconductor film containing a rare gas element is formed above the crystalline semiconductor film. An oxide film to be an etching stopper (called a barrier layer) may be formed with a thickness of 1 to 10 nm before the semiconductor film containing a rare gas element is formed. The barrier layer may be formed at the same time in the heat treatment for reducing distortion of the semiconductor film.

The semiconductor film containing a rare gas element is formed by a plasma CVD method or a sputtering method, and a gettering site with a thickness of 10 to 300 nm is formed. As the rare gas element, one or plural kinds of elements selected from helium (He), neon (Ne), argon (Ar), krypton (Kr) and xenon (Xe). Among them, argon (Ar) that is an inexpensive gas is preferable.

Here, a PCVD method is used. As a material gas, monosilane and argon are used and the ratio (monosilane:argon) is controlled to be 0.1:99.9 to 1:9, preferably, 1:99 to 5:95. In addition, the RF power density in deposition is desirably 0.0017 to 0.48 W/cm$^2$. It is preferable that the RF power density be as high as possible because the quality of the film is improved enough to obtain gettering effect, and besides, the deposition rate is improved. In addition, the pressure during the deposition is preferably 1.333 Pa (0.01 Torr) to 133.322 Pa (1 Torr). The deposition rate is improved as the pressure gets higher, however, the Ar concentration in the film is reduced when the pressure is high. Further, the deposition temperature is preferably 300 to 500° C. In this manner, the semiconductor film can be formed by a plasma CVD method, which contains argon at a concentration of $1\times10^{18}$ to $1\times10^{22}$/cm$^3$ and preferably $1\times10^{20}$ to $1\times10^{21}$/cm$^3$. By adjusting the deposition condition of the second semiconductor film within the above-described ranges, damage to the barrier layer during the deposition can be reduced so that variation in thickness of the semiconductor film and a defect such as a hole formed in the semiconductor film can be prevented.

There are two meanings in the inclusion of an ion of a rare gas element that is an inert gas in the film. One is that a dangling bond is formed, and the other is that distortion is given to the semiconductor film. In order to give the distortion to the semiconductor film, it is remarkably effective to use an element that has a larger atomic radius than that of silicon, such as argon (Ar), krypton (Kr), or xenon (Xe). In addition, by containing the rare gas element into the film, not only lattice distortion but also a dangling bond is formed to contribute to gettering action.

Subsequently, heat treatment is performed for gettering to reduce the concentration of the metal element (nickel) in the crystalline semiconductor film, or remove it. As the heat treatment for gettering, treatment using intense light irradiation, heat treatment using a furnace, or heat treatment in which the substrate is put into a heated gas and the substrate is taken out after several minutes may be employed. Here, second heat treatment for gettering (heat treatment of heating the semiconductor film until 400 to 1000° C. momentarily) is performed in a nitrogen atmosphere.

By this second heat treatment, the metal element moves into the semiconductor film containing a rare gas element, and the metal element contained in the crystalline semiconductor film covered with a barrier layer is removed or the concentration of the metal element is reduced. The metal element contained in the crystalline semiconductor film moves in a direction that is perpendicular to the substrate surface and toward the semiconductor film containing a rare gas element.

A distance of the move of the metal element in gettering may be a distance of approximately equal to the thickness of the crystalline semiconductor film, and thus, gettering can be completed in a relatively short time. Here, nickel is moved to the semiconductor film containing a rare gas element so that nickel is not segregated in the crystalline semiconductor film, and gettering is sufficiently performed so that the crystalline semiconductor film contains almost no nickel, that is, the nickel concentration in the film is $1\times10^{18}$/cm$^3$ or less and desirably $1\times10^{17}$/cm$^3$ or less. Note that, not only the semiconductor film containing a rare gas element but also the barrier layer functions as a gettering site.

Subsequently, only the semiconductor film containing a rare gas element is selectively removed using the barrier layer as an etching stopper. As a method for selectively etching only the semiconductor film containing a rare gas element, dry etching with $ClF_3$ without using plasma, or wet etching using an alkali solution such as an aqueous solution containing hydrazine or tetramethylammonium hydroxide (($CH_3$)$_4$NOH) (abbreviation: TMAH) can be employed. Note that an over etching time is made shorter so as to prevent a pin hole from being formed in the crystalline semiconductor film at this etching.

Next, the barrier layer is removed by an etchant containing hydrofluoric acid.

In addition, after performing the first heat treatment for reducing the distortion of the crystalline semiconductor film, flushing treatment using a flush substance may be performed to remove an impurity such as F. For example, flushing treatment is performed as follows: a PCVD apparatus is used, and monosilane is used as a flush substance and introduced continuously into a chamber at a gas flow rate of 8 to 10 SLM for 5 to 20 minutes and preferably 10 to 15 minutes to perform flushing treatment to the substrate surface (also called a silane flush). Note that 1 SLM is 1000 sccm, that is, 0.06 m$^3$/h. In addition, it is preferable to use a PCVD apparatus because flushing treatment and formation of the semiconductor film containing a rare gas element can be continuously performed.

Through the above steps, a favorable crystalline semiconductor film can be obtained.

After the crystalline semiconductor film is patterned into a desired shape using the first photomask, the resist mask is removed. Then, if necessary, doping of a small amount of an impurity element (boron or phosphorus) is performed to the semiconductor layer to control the threshold value of a TFT. Here, an ion doping method in which diborane ($B_2H_6$) is not mass separated but excited by plasma is employed.

Then, an oxide film on the surface of the semiconductor layer is removed with an etchant containing hydrofluoric acid, and at the same time, the surface of the semiconductor layer is cleaned.

Next, an insulating film covering the semiconductor layer is formed. The insulating film is formed by a plasma CVD method or a sputtering method, with a thickness of 1 to 200 nm. The insulating film is preferably formed with a small thickness of 10 to 50 nm with a single layer structure or a stacked-layer structure of an insulating film containing silicon, and then, surface nitriding treatment using microwave plasma is performed. The insulating film functions as a gate insulating film of a TFT to be formed later.

Subsequently, over the insulating film, a first conductive film with a thickness of 20 to 100 nm and a second conductive film with a thickness of 100 to 400 nm are stacked. In this embodiment mode, a tantalum nitride film with a thickness of 50 nm and a tungsten film with a thickness of 370 nm are sequentially stacked over an insulating film 613, and are patterned as described in Embodiment Mode 1 to form each gate electrode and each wiring. In this embodiment mode, a photomask or a reticle provided with an auxiliary pattern having a light intensity reduction function formed of a diffraction grating pattern or a semi-transparent film is used to form each gate electrode and each wiring.

Note that although the conductive film is the stacked-layer of a TaN film and a W film here, the invention is not limited to this, and the conductive film may also be formed of a stacked-layer of an element selected from Ta, W, Ti, Mo, Al, and Cu, or an alloy material or a compound material containing the element as a main component. In addition, a semiconductor film typified by a polycrystalline silicon film doped with an impurity element such as phosphorus may also be used. Further, the invention is not limited to a two-layer structure, and for example, a three-layer structure in which a tungsten film with a thickness of 50 nm, an aluminum-silicon alloy (Al—Si) film with a thickness of 500 nm, and a titanium nitride film with a thickness of 30 nm are sequentially stacked may also be employed.

For etching the first conductive film and the second conductive film (first etching treatment and second etching treatment), an ICP (Inductively Coupled Plasma) etching method may be employed. An ICP etching method is employed and the etching condition (the amount of power applied to a coil-shaped electrode, the amount of power applied to an electrode on a substrate side, the electrode temperature on a substrate side, and the like) are appropriately adjusted, thereby the film can be etched into a desired shape.

Subsequently, to add an impurity element which imparts n-type conductivity to the semiconductor layer, first doping treatment in which doping is performed on the entire surface with the gate electrode as a mask. The first doping treatment may be performed by an ion doping method or an ion injection method. The ion doping method is performed in a condition in which the dose amount is $1.5 \times 10^{13}$ atoms/cm$^2$ and the accelerating voltage is in the range of 60 to 100 kV. As the impurity element which imparts n-type conductivity, phosphorus (P) or arsenic (As) is typically used.

Then, after forming a mask of resist, second doping treatment in which the impurity element which imparts n-type conductivity is added at a concentration higher than that of the first doping treatment, is performed. The mask is provided to protect a source region, a drain region, and a region around them of a semiconductor layer forming a p-channel TFT in a pixel portion, a part of an n-channel TFT in the pixel portion, and a source region, a drain region, and a region around them of a semiconductor layer forming a p-channel TFT in a driver circuit portion.

The second doping treatment is performed by an ion doping method in a condition in which the dose amount is $1 \times 10^{15}$ to $5 \times 10^{15}$/cm$^2$ and the accelerating voltage is 50 to 100 kV. Note that the accelerating voltage in the second doping treatment is set to be lower than in the first doping treatment.

Then, after removing the mask, a mask of resist is newly formed, and third doping treatment in which an impurity element which imparts p-type conductivity (typically, boron) is added at a high concentration is performed. The mask is provided to protect a source region, a drain region, and a region around them of a semiconductor layer forming the n-channel TFT in the pixel portion, and a source region, a drain region, and a region around them of a semiconductor layer forming an n-channel TFT in the driver circuit portion.

Thereafter, the resist mask is removed. Through the above steps, an impurity region having n-type or p-type conductivity is formed in each semiconductor layer.

Subsequently, after an insulating film containing hydrogen is formed by a sputtering method, an LPCVD method, a plasma CVD method or the like, activation and hydrogenation of the impurity element added into the semiconductor layer are performed. As the insulating film containing hydrogen, a silicon nitride oxide film (SiNO film) obtained by a PCVD method is used. Here, the thickness of the insulating film containing hydrogen is set to be 50 to 200 nm. In addition, when the semiconductor film is crystallized using a metal element which promotes crystallization, such as nickel, gettering of reducing nickel in the channel forming region can also be performed at the same time as activation. Note that the insulating film containing hydrogen is a first layer of an interlayer insulating film and contains silicon oxide.

Then, an inorganic insulating film is formed as a second layer of the interlayer insulating film by a sputtering method, an LPCVD method, a plasma CVD method, or the like. As the inorganic insulating film, a single layer structure or a stacked-layer structure of an insulating film such as a silicon oxide film, a silicon nitride film or a silicon oxynitride film is employed. Here, the thickness of the inorganic insulating film is set to be 600 to 800 nm.

Next, a mask of resist is formed with a photomask, and the insulating film is selectively etched to form a contact hole. Then, the mask of resist is removed.

Subsequently, after stacking a metal film by a sputtering method, a mask of resist is formed with a photomask, and the metal stacked-layer film is selectively etched to form an electrode functioning as a source electrode or a drain electrode of a TFT. Note that the metal stacked-layer film is continuously formed in the same metal sputtering apparatus. Then, the mask of resist is removed.

Through the above steps, top gate TFTs 636, 637, 638 and 639 including a polysilicon film as an active layer can be manufactured over the same substrate.

Note that the TFT 638 provided in the pixel portion is an n-channel TFT having a plurality of channel forming regions in one TFT. The TFT 638 is a double gate TFT. Further, in the pixel portion, the TFT 639 electrically connected to a light-emitting element to be formed later is provided. Here, in order to reduce off current, a double gate p-channel TFT is described as the TFT 639, however, the invention is not particularly limited and a single gate TFT may also be provided.

In addition, the TFT 636 provided in the driver circuit portion is an n-channel TFT having two low-concentration impurity regions (also called Lov regions) with different widths respectively on both sides of the channel forming region. The two low-concentration impurity regions are overlapped with the gate electrode in a self-aligned manner. The TFT 637 is a p-channel TFT having low-concentration impurity regions (Lov regions) with the same widths respectively on both of the source side and the drain side. Each of the TFTs is a single gate TFT. In the driver circuit portion, a CMOS circuit is constituted by connecting the TFTs 636 and 637 complementarily, thereby various kind of circuits can be achieved. If necessary, a multi-gate TFT can also be provided.

Then, a first electrode 623, that is, an anode (or a cathode) of an organic light-emitting element is formed. As the first electrode 623, a single layer film or a stacked-layer film of a material having a high work function such as an element selected from Ni, W, Cr, Pt, Zn, Sn, In and Mo, or an alloy material containing the element as a main component such as TiN, TiSi$_x$N$_y$, WSi$_x$, WN$_x$, WSi$_x$N$_y$, or NbN may be used with a total thickness of 100 to 800 nm.

Specifically, as the first electrode 623, a transparent conductive film formed of a light-transmitting conductive material is preferably used, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

An example of a composition ratio in each light-transmitting conductive material is described. In the composition ratio in indium oxide containing tungsten oxide, tungsten oxide may be 1.0 wt % and indium oxide may be 99.0 wt %. In the composition ratio in indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In the composition ratio in indium tin oxide (ITO), tin oxide may be 10.0 wt % and indium oxide may be 90.0 wt %. In the composition ratio in indium zinc oxide (IZO), zinc oxide may be 10.7 wt % and indium oxide may be 89.3 wt %. Further, in the composition ratio in indium tin oxide containing titanium oxide, titanium oxide may be 5.0 wt %, tin oxide may be 10.0 wt %, and indium oxide may be 85.0 wt %. The composition ratios as described above are just examples, and the composition ratio may be set appropriately.

Then, an insulating film (e.g., an organic resin film) obtained by a coating method is patterned to form an insulator 629 (referred to as a bank, a partition wall, a barrier, an embankment, or the like) covering an end portion of the first electrode 623. It is to be noted that the insulator 629 may also be formed only by light exposure and development using a photosensitive material without being limited to patterning using a mask.

Then, a layer 624 containing an organic compound is formed by an evaporation method or a coating method.

The layer 624 containing an organic compound is a stacked-layer, and as one layer of the layer 624 containing an organic compound, a buffer layer may also be used. The buffer layer is formed of a composite material of an organic compound and an inorganic compound, and the inorganic compound has an electron-accepting property with respect to the organic compound. As the inorganic compound, one or a plurality of titanium oxide, zirconium oxide, hafnium oxide, vanadium oxide, niobium oxide, tantalum oxide, chromium oxide, molybdenum oxide, tungsten oxide, manganese oxide and rhenium oxide can be used. The buffer layer may be formed of a composite material of an organic compound having a hole-transporting property and an inorganic compound.

For example, a stacked-layer containing an organic compound (a stacked-layer of a buffer layer and an organic compound layer) is preferably provided between the first electrode 623 and a second electrode. The buffer layer is a composite layer including metal oxide (e.g., molybdenum oxide, tungsten oxide, or rhenium oxide) and an organic compound (a material having a hole-transporting property, such as 4,4'-bis[N-(3-methylphenyl)-N-phenylamino]biphenyl (abbreviation: TPD), 4,4'-bis[N-(1-naphthyl)-N-phenylamino]biphenyl (abbreviation: α-NPD), or 4,4'-bis{N-[4-(N,N-di-m-tolylamino)phenyl]-N-phenylamino}biphenyl (abbreviation: DNTPD)). Further, for example, the organic compound layer can be formed of tris(8-quinolinolato)aluminum (abbreviation: Alq$_3$), tris(4-methyl-8-quinolinolato)aluminum (abbreviation: Almq$_3$), or α-NPD. In addition, a dopant material may also be contained in the organic compound layer, and for example, N,N'-dimethylquinacridone (abbreviation: DMQd), coumarin 6, rubrene, or the like can be used. The stacked-layer containing an organic compound provided between the first electrode and the second electrode may be formed by an evaporation method such as a resistance heating method.

By adjusting the thickness of the buffer layer, distance between the first electrode and the organic compound layer can be controlled, and light-emitting efficiency can be enhanced. By adjusting the thickness of the buffer layer, an excellent image in which a light-emission color of each light-emitting element is clearly displayed can be displayed and a light-emitting device with low power consumption can be achieved.

Next, a second electrode 625, that is, a cathode (or an anode) of the organic light-emitting element is formed. As the second electrode 625, alloy such as MgAg, MgIn, or AlLi, or a transparent conductive film (e.g., ITO) can be used.

Then, a protective layer 626 is formed by an evaporation method or a sputtering method. The protective layer 626 protects the second electrode 625. When light-emission of the light-emitting element is extracted through the protective layer 626, a transparent material is preferably used. If not necessary, the protective layer 626 is not required to be provided.

Subsequently, a sealing substrate 633 is attached with a sealing material 628 to seal the light-emitting element. That is, a display region is surrounded by the sealing material, and the light-emitting display device is sealed by a pair of substrates. The interlayer insulating film of a TFT is provided over the entire surface of the substrate. Therefore, when a pattern of the sealing material is drawn inside the periphery of the interlayer insulating film, moisture or an impurity may enter from part of the interlayer insulating film that is provided outside the pattern of the sealing material. Thus, the periphery of the insulating film that is used as an interlayer insulating film of a TFT is provided inside the pattern of the sealing material, preferably, overlapped with the pattern of the sealing material so that the sealing material covers an end portion of the insulating film. Note that a region surrounded by the sealing material 628 is filled with a filler 627. Alternatively, the region surrounded by the sealing material 628 is filled with a dry inert gas.

Finally, an FPC 632 is attached to a terminal electrode by a known method with an anisotropic conductive film 631. A cross-sectional view at this stage is FIG. 5. Note that, as for the terminal electrode, a transparent conductive film that is obtained in the same step as the first electrode 623 is preferably used as a top layer and is formed over a terminal electrode formed at the same time as the gate wiring.

Figure 5:
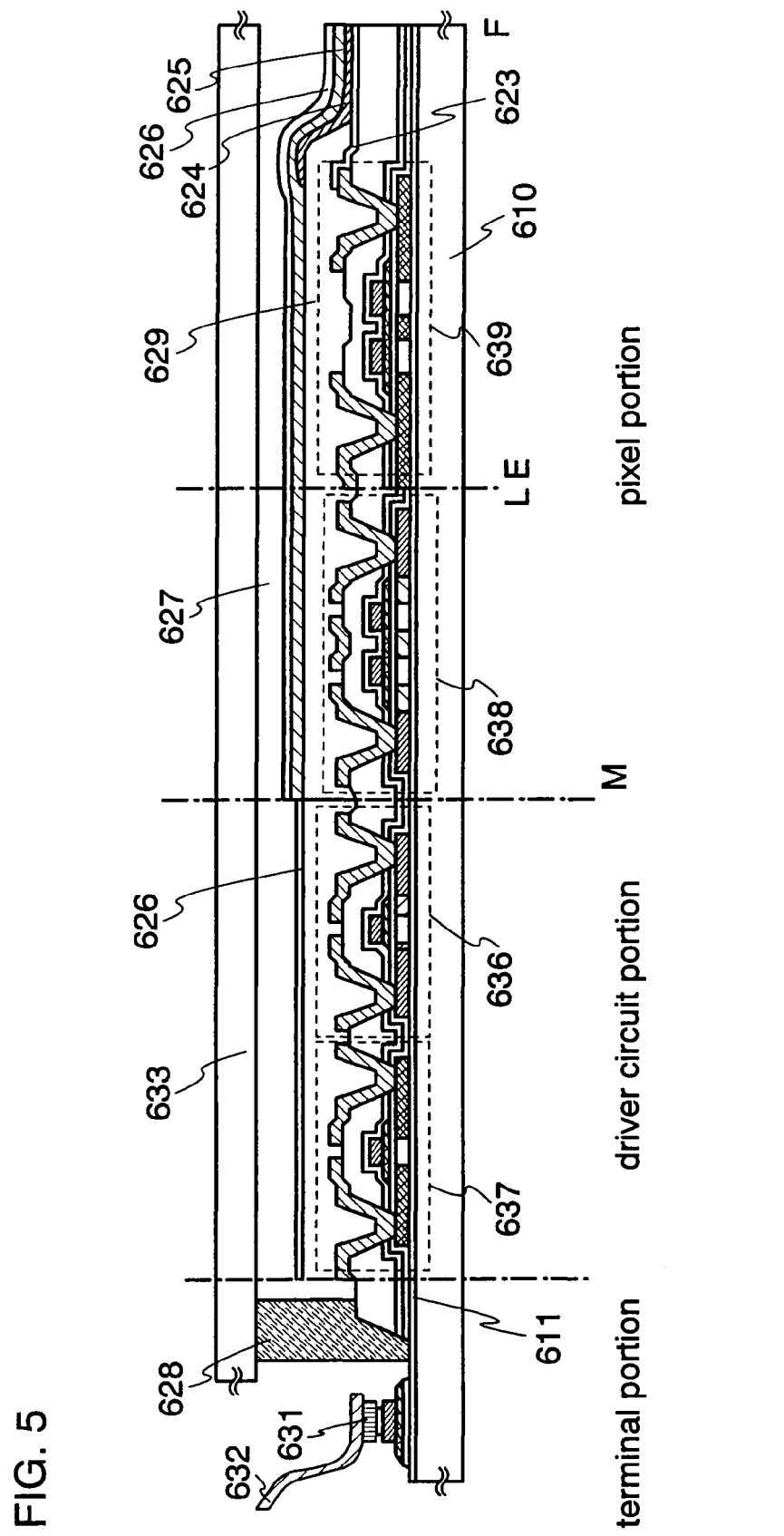
FIG. 5 is a cross-sectional view of a light-emitting device. (Embodiment Mode 5)
Figure 6:
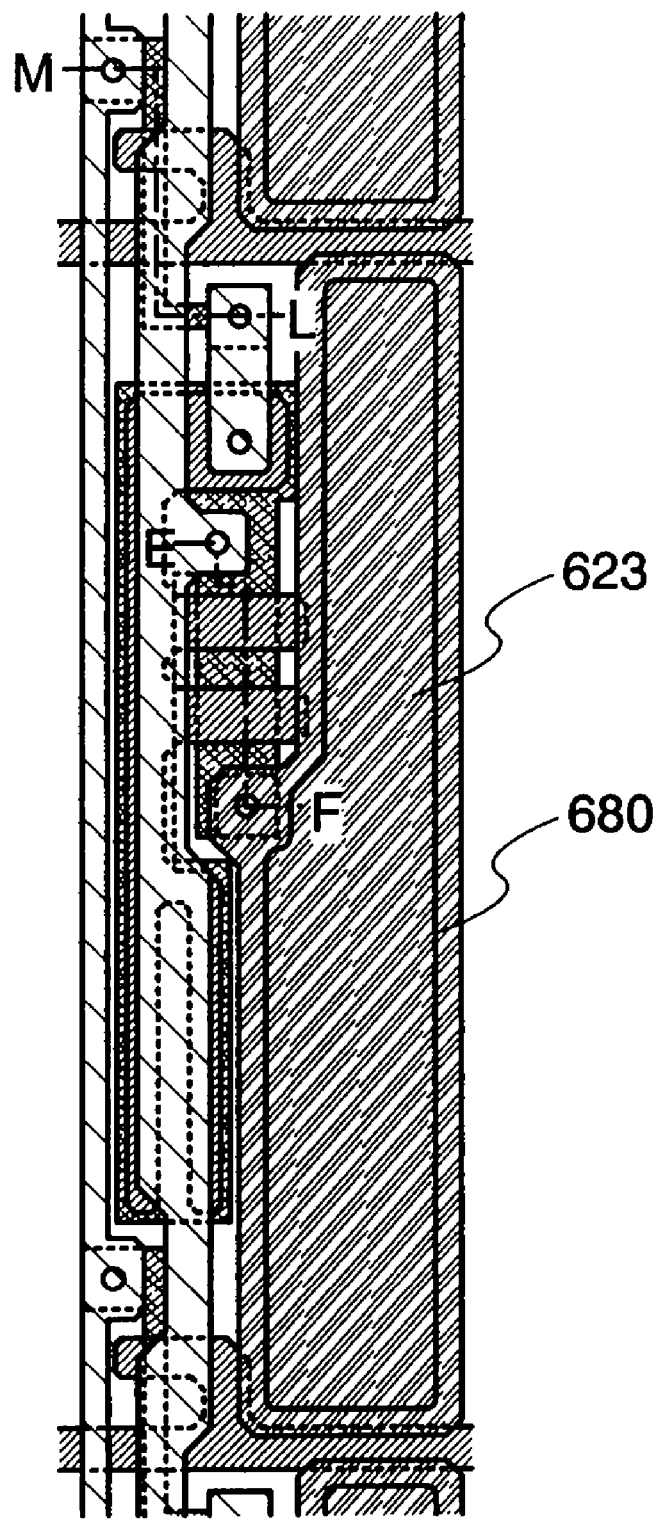
FIG. 6 is a top-plain view in a pixel portion. (Embodiment Mode 5)

In addition, FIG. 6 is a top-plane view of the pixel portion, and a cross-section taken along a chain line E-F in FIG. 6 corresponds to a cross-sectional structure of the p-channel TFT 639 in the pixel portion of FIG. 5. In addition, a cross-section taken along a chain line M-L in FIG. 6 corresponds to a cross-sectional structure of the n-channel TFT 638 in the pixel portion of FIG. 5. Note that a solid line denoted by 680 of FIG. 6 represents the edge of the insulator 629. However, in FIG. 6, only the second conductive layer is shown and the first conductive layer is not shown.

Through the above steps, the pixel portion, the driver circuit and the terminal portion can be formed over the same substrate.

In this embodiment mode, the TFT in the pixel portion is a double gate structure to reduce off current, and the TFT of Embodiment Mode 1 is used for the n-channel TFT in the driver circuit.

In addition, in the light-emitting device, a light emitting display surface may be provided on one side or both sides. In the case where the first electrode 623 and the second electrode 625 are both formed of a transparent conductive film, light of the light-emitting element is extracted through the substrate 610 and the sealing substrate 633 to both sides. In this case, a transparent material is preferably used for the sealing substrate 633 and the filler 627.

In the case where the second electrode 625 is formed of a metal film and the first electrode 623 is formed of a transparent conductive film, a structure in which light of the light-emitting element is extracted through only the substrate 610 to one side, that is, a bottom emission structure can be obtained. In this case, a transparent material is not required to be used for the sealing substrate 633 and the filler 627.

Further alternatively, in the case where the first electrode 623 is formed of a metal film and the second electrode 625 is formed of a transparent conductive film, a structure in which light of the light-emitting element is extracted through only the sealing substrate 633 to one side, that is, a top emission structure can be obtained. In this case, a transparent material is not required to be used for the substrate 610.

Materials for the first electrode 623 and the second electrode 625 are required to be selected considering a work function. Each of the first electrode and the second electrode can be an anode or a cathode depending on a pixel configuration. When polarity of a driving TFT is a p-channel type, the first electrode may be an anode and the second electrode may be a cathode. Alternatively, when polarity of the driving TFT is an n-channel type, the first electrode is preferably a cathode and the second electrode is an anode.

Figure 7:
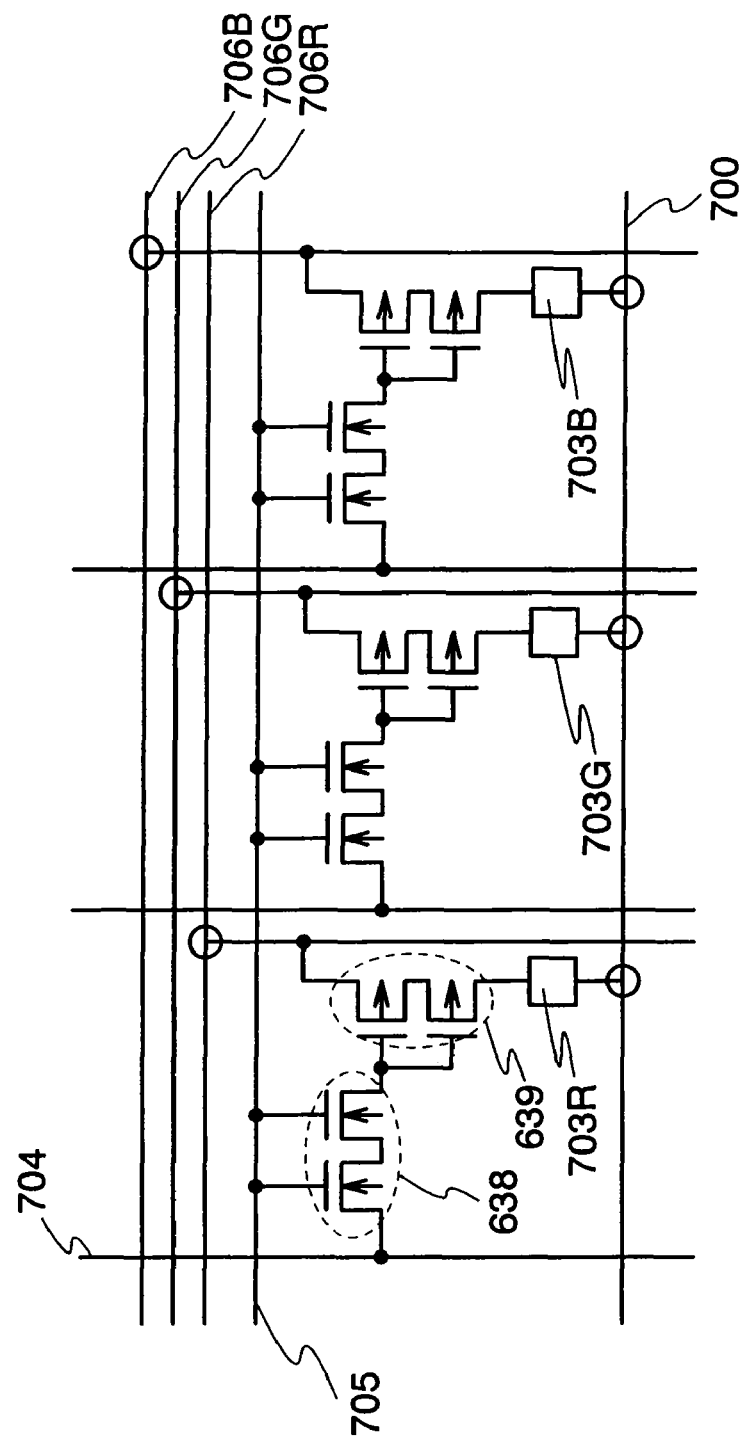
FIG. 7 is a diagram showing an equivalent circuit in a pixel portion. (Embodiment Mode 5)

FIG. 7 shows an equivalent circuit diagram in the pixel portion of this embodiment mode in a case of full color display. A TFT 638 in FIG. 7 corresponds to the switching TFT 638 in FIG. 5, and a TFT 639 corresponds to the current controlling TFT 639. In a pixel displaying a red color, an OLED 703R emitting red light is connected to a drain region of the current controlling TFT 639, and a source region thereof is provided with an anode side power supply line (R) 706R. In addition, an OLED 703R is provided with a cathode side power supply line 700. Further, in a pixel displaying a green color, an OLED 703G emitting green light is connected to a drain region of the current controlling TFT, and a source region thereof is provided with an anode side power supply line (G) 706G. In addition, in a pixel displaying a blue color, an OLED 703B emitting blue light is connected to a drain region of the current controlling TFT, and a source region thereof is provided with an anode side power supply line (B) 706B. Different voltages are applied to the pixels emitting different colors, depending on EL materials respectively. Note that reference numeral 704 denotes a source wiring and 705 denotes a gate wiring.

Further, in the light-emitting device, a driving method for image display is not particularly limited, and for example, a dot sequential driving method, a line sequential driving method, an area sequential driving method or the like may be used. Typically, the line sequential driving method may be used, and a time division gray scale driving method or an area gray scale driving method may also be arbitrarily used. In addition, a video signal to be inputted to the source line of the light-emitting device may be an analog signal or a digital signal, and the driver circuit or the like may be arbitrarily designed in accordance with the video signal.

Further, in a light-emitting device using a digital video signal, a video signal inputted to a pixel has constant voltage (CV) or has constant current (CC). As for the one in which the video signal has constant voltage (CV), there are one in which voltage of a signal applied to a light-emitting element is constant (CVCV) and one in which current of a signal applied to a light-emitting element is constant (CVCC). As for the one in which video signal has constant current (CC), there are one in which voltage of a signal applied to a light-emitting element is constant (CCCV) and one in which current of a signal applied to a light-emitting element is constant (CCCC).

Further, in the light-emitting device, a protective circuit (e.g., a protective diode) for preventing electrostatic breakdown may also be provided.

Although the example of an active matrix light-emitting device is described as a display device here, the invention can also be applied to an active matrix liquid crystal display device.

In addition, this embodiment mode can be freely combined with Embodiment Mode 1, 2, 3, or 4.

Embodiment Mode 6

Embodiment Mode 1 describes the example in which a photomask or a reticle provided with an auxiliary pattern having a light intensity reduction function is used for pattern formation of a gate wiring; however, the photomask or the reticle provided with an auxiliary pattern having a light intensity reduction function can also be used for contact opening formation of an interlayer insulating film.

Figure 8A:
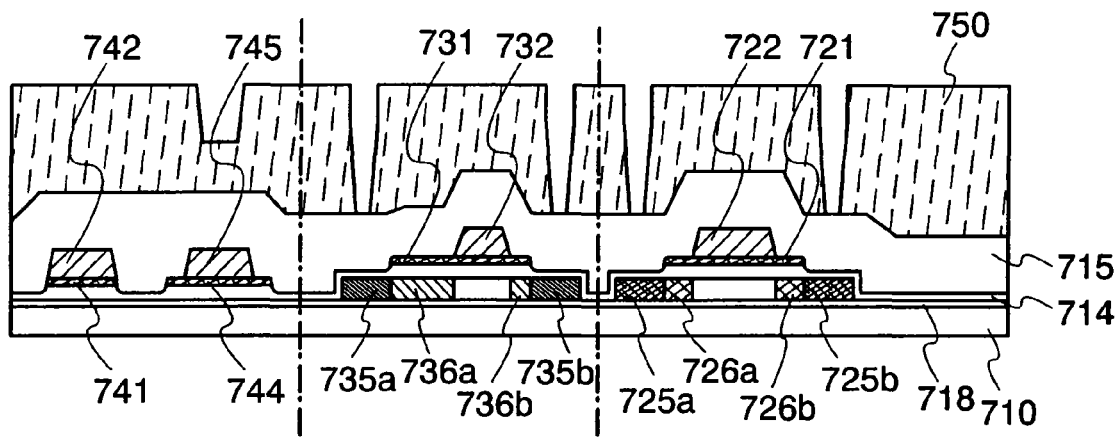
FIGS. 8A to 8C are cross-sectional views of a light-emitting device. (Embodiment Mode 6)
Figure 8B:
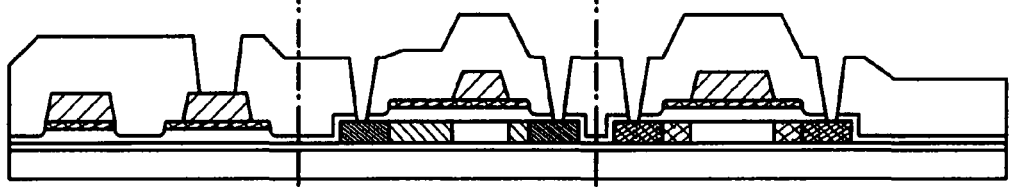
Figure 8C:
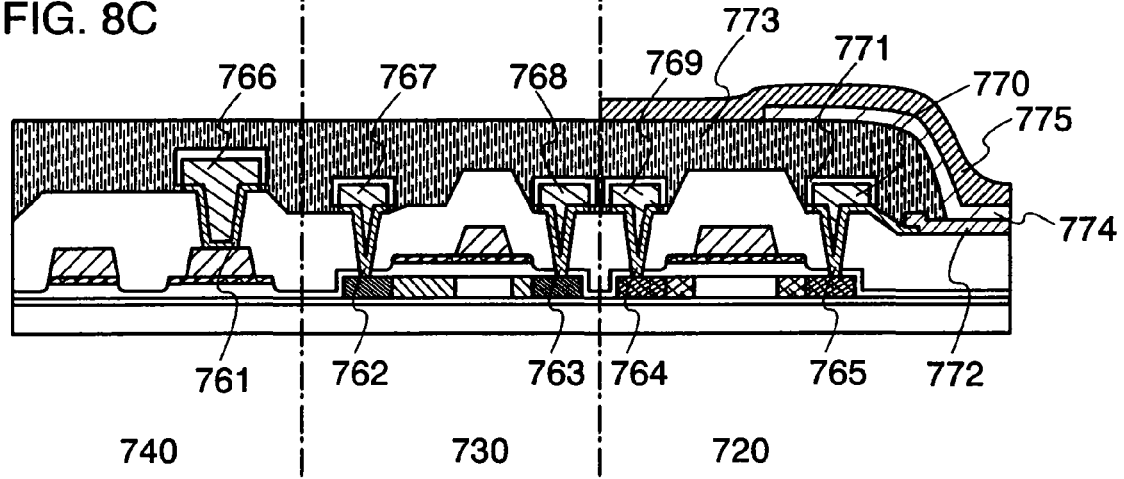

This embodiment mode describes an example in which a photomask or a reticle provided with an auxiliary pattern having a light intensity reduction function is used for contact opening formation of an interlayer insulating film, and for pattern formation of a connection wiring, with reference to FIGS. 8A to 8C.

In accordance with Embodiment Mode 4, after a base insulating film 718 is provided over a substrate 710 having an insulating surface, a semiconductor layer and a gate insulating film 714 covering the semiconductor layer are formed. Then, a first conductive film and a second conductive film are stacked. A resist pattern is formed using a photomask or a reticle provided with an auxiliary pattern having a light intensity reduction function, and etched to form a gate electrode and a wiring.

Here, similarly to Embodiment Mode 4, a first conductive layer 731 and a second conductive layer 732 are formed in a first TFT portion 730, and a first conductive layer 721 and a second conductive layer 722 are formed in a second TFT portion 720. Note that respective electrode structures are described in Embodiment Mode 4, therefore, specific description thereof is omitted here.

In addition, as shown in FIG. 8A, in a wiring portion and a contact portion 740, a region which is in contact with an upper wiring has a shape in which the width of a first conductive layer 744 is larger than that of a second conductive layer 745. Thus, even when there occurs alignment deviation to the upper wiring, contact with the first conductive layer can be obtained. Further, a wiring except in the region for contact, has a shape in which respective end portions of a first conductive layer 741 and a second conductive layer 742 are in alignment.

Then, after a resist pattern covering the second TFT portion 720 is formed, an impurity element which imparts n-type conductivity is added to the semiconductor layer. By this addition of the impurity element which imparts n-type conductivity, a drain region 735a, a source region 735b, a first LDD region 736a, and a second LDD region 736b are formed in a self-aligned manner. Note that the addition of the impurity element which imparts n-type conductivity may be performed by one doping treatment or by doping treatment plural times.

As shown in FIG. 8A, the width of the first LDD region 736a is larger than that of the second LDD region 736b in a channel length direction. In addition, the first LDD region 736a and the second LDD region 736b overlap the first conductive layer 731 with the gate insulating film 714 interposed therebetween.

Then, after the resist pattern is removed, a resist pattern covering the first TFT portion 730 is formed. An impurity element which imparts p-type conductivity is added to the semiconductor layer. By this addition of the impurity element which imparts p-type conductivity, a drain region 725a, a source region 725b, a third LDD region 726a, and a fourth LDD region 726b are formed in a self-aligned manner.

As shown in FIG. 8A, the width of the third LDD region 726a is approximately the same as that of the fourth LDD region 726b in a channel length direction. In addition, the third LDD region 726a and the fourth LDD region 726b overlap the first conductive layer 721 with the gate insulating film 714 interposed therebetween.

In addition, the order of adding the impurity elements is not particularly limited, and for example, the impurity element which imparts p-type conductivity may be added to the semiconductor layer first and then, the impurity element which imparts n-type conductivity may be added to the semiconductor layer.

Then, after the impurity elements added into the semiconductor layer are activated, an interlayer insulating film 715 is formed and thereover, a resist film is applied.

Subsequently, exposure and development of the resist film are performed using a photomask or a reticle provided with an auxiliary pattern having a light intensity reduction function, to form a resist pattern 750 shown in FIG. 8A. The resist pattern 750 is a mask for forming an opening in the lower insulating film, and depending on the photomask or the reticle provided with an auxiliary pattern having a light intensity reduction function, openings with different depths are provided.

Then, etching is performed using the resist pattern 750 to form an opening in the interlayer insulating film 715 and the gate insulating film 714. According to this etching, opening formation in the interlayer insulating film 715 and the gate insulating film 714 is performed while etching the resist pattern 750, thereby openings with different depths can be formed.

Then, the resist pattern is removed. A cross-sectional view at this stage is FIG. 8B.

After that, a staked layer of a third conductive layer (e.g., a titanium nitride film) and a fourth conductive layer (e.g., an aluminum film) is formed. Patterning is performed to form a third conductive layer 761 of a connection wiring, a fourth conductive layer 766 of the connection wiring, a third conductive layer 762 of a drain wiring, a fourth conductive layer 767 of the drain wiring, a third conductive layer 763 of a source wiring, and a fourth conductive layer 768 of the source wiring. In addition, in the second TFT portion, a third conductive layer 765 of a connection electrode, a fourth conductive layer 770 of the connection electrode, a third conductive layer 769 of a source electrode, and a fourth conductive layer 764 of the source electrode are formed. Here, a photomask or a reticle provided with an auxiliary pattern having a light intensity reduction function is used for pattern formation of the connection electrode. The plane-surface area of third conductive layer 765 of the connection electrode is larger than that of the fourth conductive layer 770 of the connection electrode.

Subsequently, plasma treatment is performed to oxide the fourth conductive layers so that oxide films 771 are formed over the fourth conductive layers respectively.

Note that, when the fourth conductive layer is oxidized by plasma treatment, the plasma treatment is performed under an oxygen atmosphere (e.g., under an atmosphere of oxygen ($O_2$) and a rare gas (containing at least one of He, Ne, Ar, Kr and Xe), under an atmosphere of oxygen, hydrogen ($H_2$), and a rare gas, or under an atmosphere of dinitrogen monoxide and a rare gas). On the other hand, when the film is nitrided by plasma treatment, the plasma treatment is performed under a nitrogen atmosphere (e.g., under an atmosphere of nitrogen ($N_2$) and a rare gas (containing at least one of He, Ne, Ar, Kr and Xe), under an atmosphere of nitrogen, hydrogen, and a rare gas, or under an atmosphere of $NH_3$ and a rare gas). As the rare gas, for example, Ar can be used. Further, a mixed gas of Ar and Kr may also be used. Therefore, an insulating film formed by plasma treatment contains the rare gas (containing at least one of He, Ne, Ar, Kr and Xe) used in the plasma treatment, and the insulating film contains Ar in the case of using Ar.

In addition, when plasma treatment is performed to the fourth conductive layer, the plasma treatment is performed under an atmosphere of the above described gas where electron density is $1 \times 10^{11}$ cm$^{-3}$ or higher and electron temperature of plasma is 1.5 eV or lower. More specifically, it is performed where the electron density is in the range of $1 \times 10^{11}$ cm$^{-3}$ to $1 \times 10^{13}$ cm$^{-3}$ and the electron temperature of plasma is in the range of 0.5 eV to 1.5 eV. Since the electron density of plasma is high and the electron temperature in the vicinity of an object to be processed (here, the fourth conductive layer) formed over the substrate is low, damage due to plasma to the object to be processed can be prevented. Further, because of the high electron density of plasma which is $1 \times 10^{11}$ cm$^{-3}$ or higher, the oxide film or the nitride film, which is formed by oxidizing or nitriding the object to be processed using the plasma treatment, has excellent uniformity in thickness or the like and dense film quality as compared with a film formed by a CVD method, a sputtering method, or the like. In addition, because of the low electron temperature of plasma which is 1.5 eV or lower, oxidizing or nitriding treatment can be performed at a low temperature as compared with conventional plasma treatment or a thermal oxidation method. For example, oxidizing or nitriding treatment can be sufficiently performed even by plasma treatment at a temperature that is lower than a strain point of a glass substrate by 100° C. or more. Note that as a frequency for forming plasma, a high frequency wave such as a microwave (2.45 GHz) can be used.

Then, one electrode 772 for structuring a light-emitting element is formed. The electrode 772 is provided so as to partially overlap the third conductive layer 765 of the connection electrode, and is electrically connected to the TFT. As the electrode 772, a single layer film or a stacked-layer film of a material having a high work function such as an element selected from Ni, W, Cr, Pt, Zn, Sn, In and Mo, or an alloy material containing the element as a main component such as TiN, TiSi$_X$N$_Y$, WSi$_X$, WN$_X$, WSi$_X$N$_Y$, or NbN may be used with a total thickness of 100 to 800 nm.

Then, an insulator 773 (referred to as a bank, a partition wall, a barrier, an embankment, or the like) covering an end portion of the electrode 772 for structuring a light-emitting element is formed.

Then, a layer 774 containing an organic compound is formed by an evaporation method or a coating method over the electrode 772.

Next, the other electrode 775 for structuring the light-emitting element is formed over the layer 774 containing an organic compound. As the electrode 775, alloy such as MgAg, MgIn, or AlLi, or a transparent conductive film (e.g., ITO) may be used.

In this manner, in the second TFT portion 720, the light-emitting element structured by the electrode 772, the layer 774 containing an organic compound, and the electrode 775 and a p-channel TFT which is connected to the light-emitting element are formed. As for the TFT which is connected to the light-emitting element, LDD regions with the same widths are preferably provided in order to reduce off current.

Further, as for a TFT constituting a part of a buffer circuit of the driver circuit, an n-channel TFT shown in the first TFT portion 730 is preferably provided. The n-channel TFT shown in the first TFT portion 730 can relieve electric field intensity in the vicinity of the drain, and thus, can prevent deterioration of a circuit. In addition, the n-channel TFT shown in the first TFT portion 730 can reduce power consumption of the circuit because parasitic capacitance can be reduced.

In addition, this embodiment mode can be freely combined with Embodiment Mode 1, 2, 3, 4, or 5.

Embodiment Mode 7

Figure 9A:
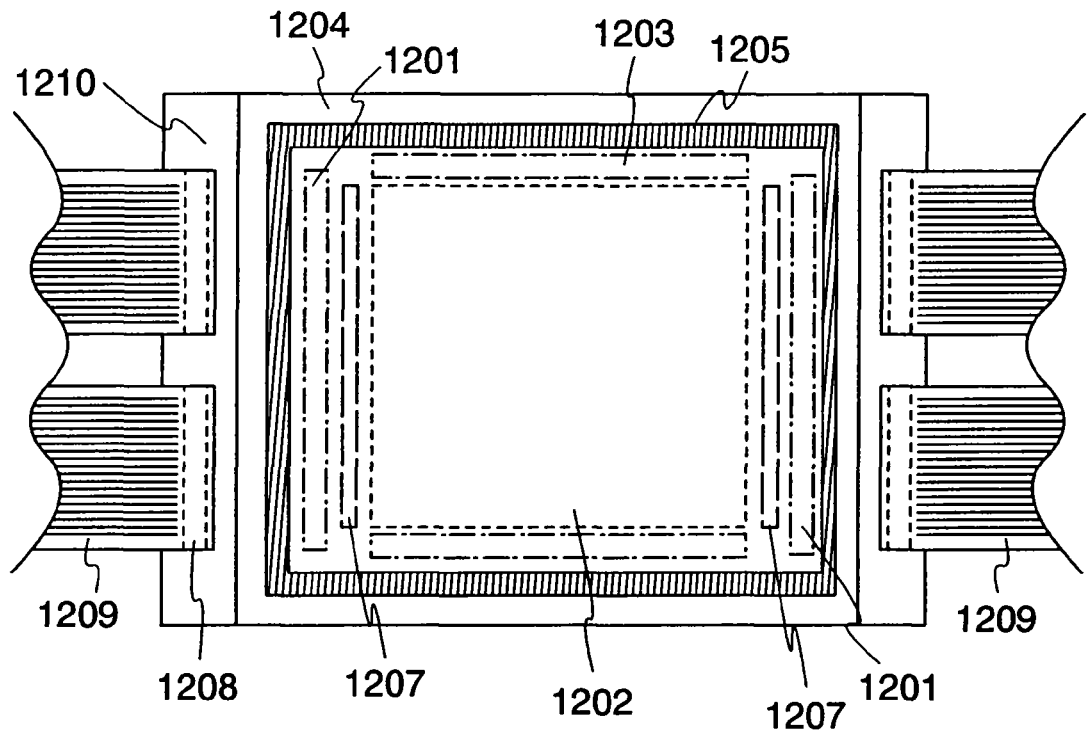
FIGS. 9A and 9B are views showing an example of a module.
Figure 9B:
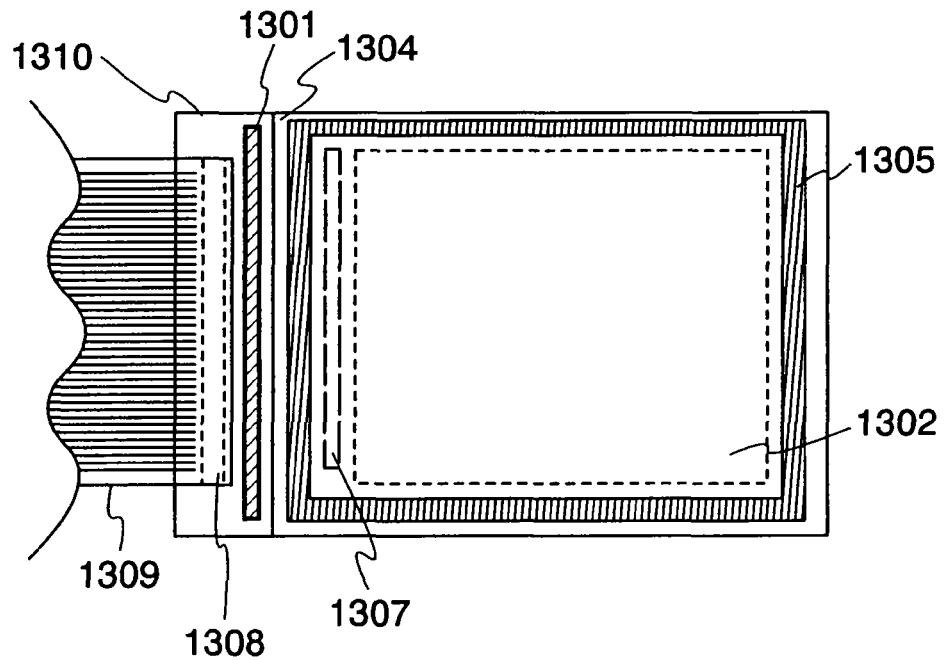

This embodiment mode describes an example in which an FPC or a driver IC is mounted on a light-emitting display panel with reference to FIGS. 9A and 9B.

FIG. 9A shows an example of a top-plane view of a light-emitting device in which FPCs 1209 are attached to four terminal portions 1208 respectively. Over a substrate 1210, a pixel portion 1202 including a light-emitting element and a TFT, a gate driver circuit 1203 including a TFT, and a source driver circuit 1201 including a TFT are formed. An active layer of a TFT is formed of a semiconductor film having a crystal structure, and these circuits are formed over the same substrate. Therefore, an EL display panel that realizes system-on-panel can be manufactured.

It is to be noted that the substrate 1210 is covered with a protective film except for a contact portion, and a base layer containing a substance having a photocatalyst function is provided over the protective film.

Two connection regions 1207 which interpose the pixel portion are provided so that a second electrode of a light-emitting element is in contact with a wiring of a lower layer. Note that, a first electrode of the light-emitting element is electrically connected to the TFT provided in the pixel portion.

In addition, a sealing substrate 1204 is fixed to the substrate 1210 with a sealing material 1205 surrounding the pixel portion and the driver portion, and a filler material surrounded by the sealing material.

The structure shown in FIG. 9A shows an example suitable for a light-emitting device with a relatively large size of XGA class (e.g., 4.3-inch diagonal), whereas FIG. 9B shows an example in the case of adopting a COG method suitable at a small size with reduced frame size (e.g., 1.5-inch diagonal).

In FIG. 9B, a driver IC 1301 is mounted over a substrate 1310, and an FPC 1309 is mounted over a terminal portion 1308 provided at the top the driver IC. From an aspect of increasing productivity, a plurality of driver ICs 1301 is mounted over a rectangle substrate with each side of 300 to 1000 mm or more. That is, a plurality of circuit patterns, each of which has a driver circuit portion and an input/output terminal as one unit, is formed over the substrate and divided finally so that the driver ICs can be obtained separately. As for the length of the driver IC, considering the length of each side of the pixel portion or the pixel pitch, the driver IC may be formed to have a rectangular shape with a long side of 15 to 80 mm and a short side of 1 to 6 mm, or may be formed so that the length of a long side is a length corresponding to one side of a pixel region or a length in which one side of each driver circuit is added to one side of the pixel portion.

For the outside dimension, the driver IC has an advantage over an IC chip in the length of the long side. When a driver IC formed with a long side of 15 to 80 mm is used, the number of driver ICs to be required for mounting corresponding to the pixel portion is smaller as compared with the case of using an IC chip, thereby improving the yield in manufacturing. In addition, when a driver IC is formed over a glass substrate, the productivity is not reduced because the driver IC is not limited by the shape of a host substrate. This is a great advantage as compared with a case of taking out IC chips from a circular silicon wafer.

In addition, a TAB method may also be employed, and in that case, a plurality of tapes is attached and driver ICs may be mounted over the tapes. Similarly to the case of the COG method, a single driver IC may be mounted over a single tape, and in this case, a metal piece or the like for fixing the driver IC may be attached together from an aspect of the strength.

A connection region 1307 provided between a pixel portion 1302 and the driver IC 1301 is provided so that a second electrode of a light-emitting element is in contact with a wiring of a lower layer. Note that a first electrode of the light-emitting element is electrically connected to a TFT provided in the pixel portion.

In addition, a sealing substrate 1304 is fixed to the substrate 1310 with a sealing material 1305 surrounding the pixel portion 1302, and a filler material surrounded by the sealing material.

When an amorphous semiconductor film is used as an active layer of a TFT in the pixel portion, it is difficult to form a driver circuit over the same substrate, therefore, the structure of FIG. 9B is employed even for a large size.

In addition, although the example of an active matrix light-emitting device is described as a display device here, the invention can also be applied to an active matrix liquid crystal display device, of course. In the active matrix liquid crystal display device, pixel electrodes arranged in matrix are driven to form a display pattern on the screen. Specifically, voltage is applied between a selected pixel electrode and an opposite electrode corresponding to the pixel electrode, thereby a liquid crystal layer disposed between the pixel electrode over the element substrate and the opposite electrode over the opposite substrate is optically modulated, and the optical modulation is recognized as a display pattern by a viewer. The opposite substrate and the element substrate are arranged at an even interval and the space therebetween is filled with a liquid crystal material. As for the liquid crystal material, a method may be employed in which the liquid crystal material is dropped under reduced pressure so that a bubble does not enter with the sealing material as a closed pattern and the substrates are attached to each other. Alternatively, a dip method (pumping method) may be employed in which the liquid crystal is injected using capillary phenomenon after a seal pattern having an opening portion is provided and the TFT substrates are attached to each other.

In addition, the invention can also be applied to a liquid crystal display device using a field sequential driving method in which light is shuttered without using a color filter and backlight light sources for three colors of R, G, and B are flashed on and off at high speed.

As described above, by implementing the invention, that is, by using the manufacturing method or the structure described in any of Embodiment Modes 1 to 6, various electronic equipment can be completed.

Embodiment Mode 8

As a semiconductor device and electronic equipment of the invention, there are a video camera, a digital camera, a goggle type display (head mount display), a navigation system, an audio reproducing device (e.g., a car stereo system or an audio component), a notebook personal computer, a game machine, a portable information terminal (e.g., a mobile computer, a mobile phone, a mobile game machine, or an electronic book), an image reproducing device equipped with a recording medium (specifically, a device for reproducing a recording medium such as Digital Versatile Disc (DVD) and including a display for displaying the image), and the like. Specific examples of the electronic equipment are shown in FIGS. 10A to 10E, and 11.

Figure 10A:
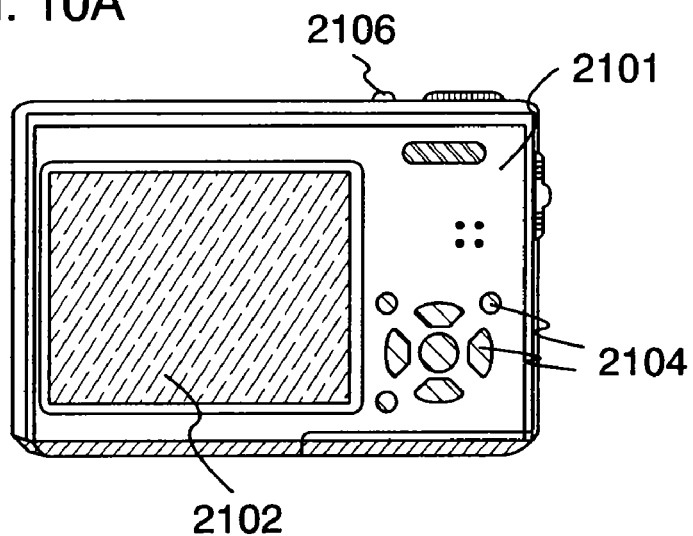
FIGS. 10A to 10E are views of showing an example of electronic equipment.

FIG. 10A shows a digital camera, which includes a main body 2101, a display portion 2102, an imaging portion, operating keys 2104, a shutter 2106, and the like. Note that FIG. 10A is a view on a display portion 2102 side and the imaging portion is not shown. According to the invention, a highly reliable digital camera with a high-definition display portion can be achieved.

Figure 10B:
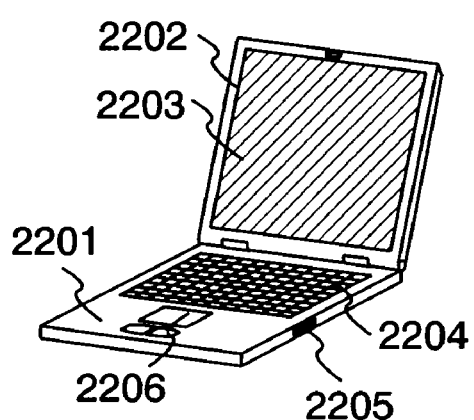

FIG. 10B shows a notebook personal computer, which includes a main body 2201, a chassis 2202, a display portion 2203, a keyboard 2204, an external connection port 2205, a pointing mouse 2206, and the like. According to the invention, a highly reliable notebook personal computer with a high-definition display portion can be achieved.

Figure 10C:
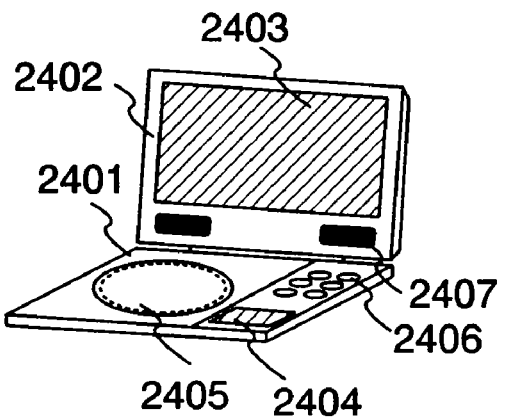

FIG. 10C shows a mobile image reproducing device equipped with a recording medium (specifically a DVD reproducing device), which includes a main body 2401, a chassis 2402, a display portion A 2403, a display portion B 2404, a recording medium (e.g., a DVD) reading portion 2405, operating keys 2406, a speaker portion 2407 and the like. The display portion A 2403 mainly displays image data and the display portion B 2404 mainly displays character data. Note that the image reproducing device equipped with a recording medium also includes a home game machine or the like. According to the invention, a highly reliable image reproducing device with a high-definition display portion can be achieved.

Figure 10D:
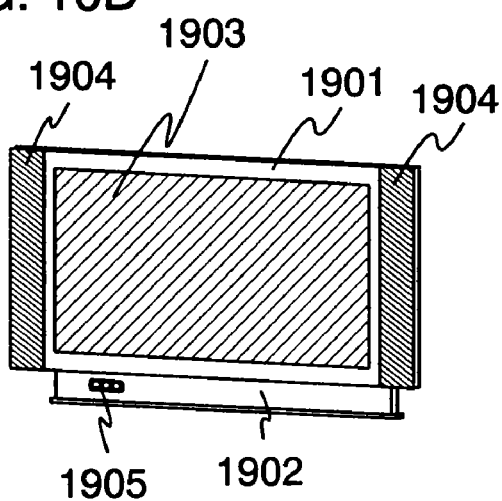

FIG. 10D shows a display device, which includes a chassis 1901, a support 1902, a display portion 1903, a speaker 1904, a video input terminal 1905, and the like. The display device is manufactured by using a thin film transistor formed by the manufacturing method described in the above embodiment mode, for the display portion 1903 and the driver circuit. Note that, the display device includes a liquid crystal display device, a light-emitting device or the like, including all kinds of display devices for displaying data, such as for a computer, for receiving TV broad casting, or for displaying advertisement. According to the invention, a highly reliable display device with a high-definition display portion, particularly a large-sized display device with a large screen at 22 to 50 inches can be achieved.

In addition, a thin film integrated circuit having a TFT of the invention can also be used as a non-contact thin film integrated circuit device (also called a wireless IC tag or an RFID (Radio Frequency Identification)) by additionally forming an antenna or the like. By attaching an IC tag to various electronic equipment, a distribution channel or the like of the electronic equipment can be clarified.

Figure 10E:
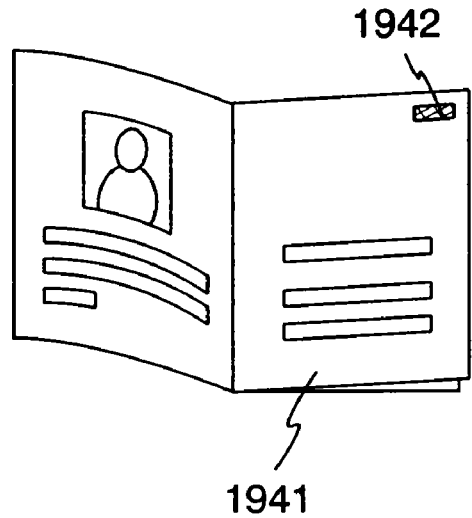

FIG. 10E shows a passport 1941 to which a wireless IC tag 1942 is attached. The wireless IC tag may also be embedded in the passport 1941. Similarly, the wireless IC tag may be attached to or embedded in a driver's license, a credit card, a banknote, a coin, a certificate, a merchandise coupon, a ticket, a traveler's check (T/C), a health insurance card, a residence certificate, a family register, and the like. In this case, only data showing that this is a real one is inputted into the wireless IC tag, and access authority is set so that data cannot be read out or written in illegally, which can be achieved by using the memory described in another embodiment mode described above. By using as the tag in this way, distinguishing from forged ones can be possible. In addition, the wireless IC tag can also be used as a memory. Further, by providing the wireless IC tag for containers for wrapping objects, recording media, personal belongings, foods, clothes, livingware, electronic equipment, and the like, a system such as an inspection system can be more effectively carried out.

Figure 11:
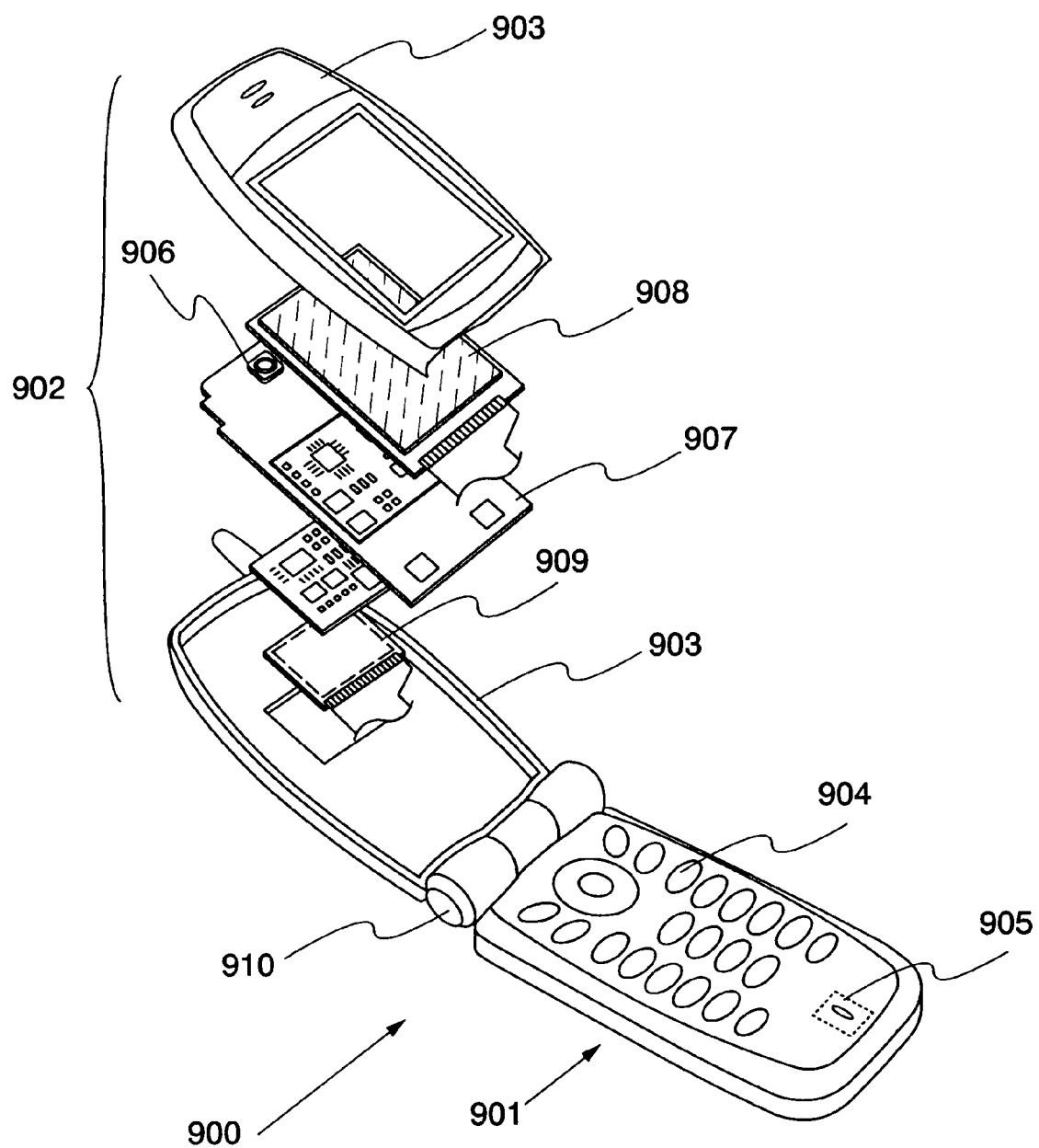
FIG. 11 is a view showing an example of electronic equipment.

A mobile phone shown in FIG. 11 includes a main body (A) 901 provided with operating switches 904, a microphone 905 and the like and a main body (B) 902 provided with a display panel (A) 908, a display panel (B) 909, a speaker 906 and the like, which are connected with a hinge 910 so that the mobile phone can be opened and folded. The display panel (A) 908 and the display panel (B) 909 are incorporated into a chassis 903 of the main body (B) 902 together with a circuit substrate 907. Pixel portions of the display panel (A) 908 and the display panel (B) 909 are arranged so as to be seen from an open window formed in the chassis 903.

The specifications of the display panel (A) 908 and the display panel (B) 909, such as the number of pixels can be appropriately set in accordance with the function of a mobile phone 900. For example, the display panel (A) 908 and the display panel (B) 909 can be used as a main display screen and a sub-display screen respectively in combination.

According to the invention, a highly reliable portable information terminal with a high-definition display portion can be achieved.

The mobile phone of this embodiment mode can be changed into various modes in accordance with the function or application. For example, by incorporating an imaging device into the hinge 910, a mobile phone equipped with a camera can be provided. In addition, also when the operating switches 904, the display panel (A) 908 and the display panel (B) 909 are incorporated into one chassis, the aforementioned effect can be obtained. Further, when the structure of this embodiment mode is applied to an information display terminal having a plurality of display portions, the same effect can be obtained.

As described above, by implementing the invention, that is, by using the manufacturing method or the structure described in any of Embodiment Modes 1 to 7, various electronic equipment can be completed.

According to the invention, various circuits are formed over the same substrate, and an LDD region with a width suitable for each circuit can be formed in a self-aligned manner. In addition, the width of the LDD region can be controlled precisely in accordance with each circuit. By optimizing an LDD region of a TFT in each circuit, improvement of reliability, reduction of power consumption, or high-speed operation can be achieved.

For example, a TFT having LDD regions with different widths respectively on both sides of the channel forming region, a TFT having LDD regions with the same widths respectively on both sides of the channel forming region, a TFT having no LDD region, or the like can be formed over the same substrate without increasing the number of manufacturing steps.

This application is based on Japanese Patent Application serial no. 2005-192302 filed in Japan Patent Office on 30th, Jun. 2005, and the entire contents of which are hereby incorporated by reference.

What is claimed is:

1. A manufacturing method of a semiconductor device, the method comprising:
    forming an insulating film over a semiconductor layer;
    forming a first conductive film over the insulating film;
    forming a second conductive film over the first conductive film;
    forming a resist pattern having a first region and a second region over the second conductive film, with a photomask or a reticle having a diffraction grating pattern or a semi-transparent portion;
    selectively etching the first conductive film and the second conductive film to form a first gate electrode and a second gate electrode comprising a third region, a fourth region and a fifth region;
    injecting an impurity element into the semiconductor layer with the second gate electrode as a mask to form a source region and a drain region in the semiconductor layer; and
    injecting an impurity element into the semiconductor layer through the fourth region and the fifth region, with the first gate electrode as a mask to form a first impurity region and a second impurity region in a region of the semiconductor layer overlapped with the fourth region and the fifth region,
    wherein a width of the first impurity region is larger than that of the second impurity region,
    wherein a thickness of the first region is larger than that of the second region,
    wherein the third region is provided between the fourth region and the fifth region,
    wherein the first gate electrode is provided over the third region, and
    wherein a width of the fourth region is larger than that of the fifth region.

2. The manufacturing method of a semiconductor device according to claim 1, wherein the first impurity region and the second impurity region contain an n-type impurity element at a lower concentration than that in the source region and the drain region.

3. A manufacturing method of a semiconductor device, the method comprising:
    forming an insulating film over a semiconductor layer;
    forming a first conductive film over the insulating film;
    forming a second conductive film over the first conductive film;
    forming a resist pattern having a first region and a second region over the second conductive film, with a photomask or a reticle having a diffraction grating pattern or a semi-transparent portion;
    selectively etching the first conductive film and the second conductive film to form a first gate electrode and a second gate electrode comprising a third region, a fourth region and a fifth region; and
    injecting an impurity element into the semiconductor layer with the second gate electrode as a mask to form a source region and a drain region on both sides of a channel forming region in the semiconductor layer, and to form a first impurity region and a second impurity region in a region of the semiconductor layer overlapped with the fourth region and the fifth region, through the fourth region and the fifth region,
    wherein a width of the first impurity region is larger than that of the second impurity region,
    wherein a thickness of the first region is larger than that of the second region,
    wherein the third region is provided between the fourth region and the fifth region,
    wherein the first gate electrode is provided over the third region, and
    wherein a width of the fourth region and the fifth region is larger than that of the fifth region.

4. The manufacturing method of a semiconductor device according to claim 3, wherein the first impurity region and the second impurity region contain an n-type impurity element at a lower concentration than that in the source region and the drain region.

5. The manufacturing method of a semiconductor device according to claim 1, wherein the first impurity region and the second impurity region contain a p-type impurity element at a lower concentration than that in the source region and the drain region.

6. The manufacturing method of a semiconductor device according to claim 3, wherein the first impurity region and the second impurity region-contain a p-type impurity element at a lower concentration than that in the source region and the drain region.

7. The manufacturing method of a semiconductor device according to claim 1, wherein the resist pattern has an asymmetrical shape in a direction parallel to a channel length direction.

8. The manufacturing method of a semiconductor device according to claim 3, wherein the resist pattern has an asymmetrical shape in a direction parallel to a channel length direction.

9. The manufacturing method of a semiconductor device according to claim 1, wherein the first conductive film and the second conductive film are formed of different materials to each other.

10. The manufacturing method of a semiconductor device according to claim 3, wherein the first conductive film and the second conductive film are formed of different materials to each other.

* * * * *